(12) United States Patent
Myung et al.

(10) Patent No.: US 8,912,604 B2
(45) Date of Patent: Dec. 16, 2014

(54) SEMICONDUCTOR DEVICE HAVING BURIED BIT LINES AND METHOD FOR FABRICATING THE SAME

(71) Applicant: SK Hynix Inc., Gyeonggi-do (KR)

(72) Inventors: Ju-Hyun Myung, Gyeonggi-do (KR); Eui-Seong Hwang, Gyeonggi-do (KR); Eun-Shil Park, Gyeonggi-do (KR); Tae-Yoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/800,556

(22) Filed: Mar. 13, 2013

(65) Prior Publication Data
US 2014/0061745 A1   Mar. 6, 2014

(30) Foreign Application Priority Data
Aug. 28, 2012   (KR) .................. 10-2012-0094372

(51) Int. Cl.
  *H01L 27/108*   (2006.01)
  *H01L 29/78*    (2006.01)
  *H01L 29/165*   (2006.01)
  *H01L 29/45*    (2006.01)
  *H01L 29/66*    (2006.01)
  *H01L 29/417*   (2006.01)

(52) U.S. Cl.
  CPC ...... *H01L 27/10829* (2013.01); *H01L 29/7827* (2013.01); *H01L 27/10885* (2013.01); *H01L 27/10876* (2013.01); *H01L 29/165* (2013.01); *H01L 29/45* (2013.01); *H01L 29/66666* (2013.01); *H01L 29/41741* (2013.01)
  USPC .................................. 257/347; 257/E51.011

(58) Field of Classification Search
  USPC ...................... 257/E21.41, 302, 347
  See application file for complete search history.

(56) References Cited

U.S. PATENT DOCUMENTS

| 7,736,969 B2 | 6/2010 | Abbott et al. |
| 2006/0246720 A1 | 11/2006 | Wu et al. |
| 2010/0308466 A1 | 12/2010 | Takesako |
| 2011/0101447 A1 * | 5/2011 | Cho .............................. 257/329 |

FOREIGN PATENT DOCUMENTS

KR   1020130065264   6/2013

* cited by examiner

*Primary Examiner* — Thomas L Dickey
(74) *Attorney, Agent, or Firm* — IP & T Group LLP

(57) ABSTRACT

A semiconductor device includes body lines, formed substantially perpendicular to a substrate, and having recessed sidewalls, buried bit lines, buried in the recessed sidewalls, and including a metal silicide, and a barrier layer interposed between each of the buried bit lines and the body lines corresponding thereto, and containing germanium.

12 Claims, 17 Drawing Sheets

SEMICONDUCTOR DEVICE HAVING BURIED BIT LINES AND METHOD FOR FABRICATING THE SAME

CROSS-REFERENCE TO RELATED APPLICATIONS

The present application claims priority of Korean Patent Application No. 10-2012-0094372, filed on Aug. 28, 2012, which is incorporated herein by reference in its entirety.

BACKGROUND

1. Field

Exemplary embodiments of the present invention relate to a semiconductor device fabrication technology, and more particularly, to a semiconductor device having buried bit lines and a method for fabricating the same.

2. Description of the Related Art

Most semiconductor devices include transistors. For example, a semiconductor memory device represented by a DRAM includes a memory cell having a MOSFET. In general, in a MOSFET, since source/drain regions are formed in the surface of a substrate, a planar channel is formed between the source region and the drain region. Such a general MOSFET is thus referred to as a planar channel transistor.

As improvements in degree of integration and performance are continuously demanded for a semiconductor memory device, a technology for fabricating a MOSFET faces physical limitations. For example, as the size of a memory cell shrinks, the size of a MOSFET shrinks, which causes the channel length of the MOSFET to be shortened. If the channel length of a MOSFET is shortened, data maintaining properties are likely to deteriorate, whereby the characteristics of the memory device may be degraded.

In consideration of these problems, a vertical channel transistor (VCT) has been suggested in the art. In the vertical channel transistor, junction regions are formed at the respective ends of a pillar, and any one of the junction regions is connected with a bit line. The bit line is buried in a trench defined between pillars, so it is referred to as a buried bit line (BBL).

Two adjacent memory cells each including a vertical channel transistor (VCT) and a buried bit line (BBL) are adjacent to one buried bit line (BBL). Therefore, the buried bit line (BBL) is formed in a space (for example, a trench) between two adjacent memory cells, and an OSC (one-side-contact) process is performed to connect one memory cell with one buried bit line (BBL). The OSC process is a process for allowing each buried bit line (BBL) to be brought into contact with any one of two adjacent memory cells. Thus, the OSC process is also referred to as a single-side-contact (SSC) process. Generally, in a memory device that adopts a planar channel transistor, in order to connect a planar channel transistor with a bit line, a contact plug process with a high aspect ratio is required. In contrast, in the case of adopting a vertical channel transistor and a buried bit line, since the vertical channel transistor and the buried bit line may be brought into direct contact with each other, a contact plug process is not required. Therefore, the parasitic capacitance of the bit line may be reduced.

FIG. 1 is a cross-sectional view illustrating buried bit lines according to the conventional art.

Referring to FIG. 1, a plurality of body lines 14, which are separated by trenches 13, are formed on a substrate 11. The body lines 14 are formed through performing an etching process for the substrate 11, using mask patterns 12. A passivation layer 15 is formed on the sidewalls of the body lines 14 and on the surfaces of the trenches 13. Open parts 17 are defined in the passivation layer 15 through an OSC process. Each open part 17 opens any one sidewall of each body line 14. Buried bit lines 16 are formed in the trenches 13. The buried bit lines 16 are connected with the body lines 14 through the open parts 17. Each buried bit line 16 is connected with any one of two adjacent body lines 14. While not shown in the drawing, the upper portion of each body line 14 includes a pillar in which source/drain regions and a channel for a vertical channel transistor are formed.

Referring to FIG. 1, in order to connect each buried bit line 16 to the sidewall of any one of the adjacent body lines 14, an OSC process is adopted. In order to realize the OSC process, various methods such as a liner layer and a tilt ion implantation process, an OSC mask process and the like have been proposed.

However, these methods fail to form a uniform and reproducible OSC structure due to difficulties in processing. Also, as high integration further proceeds, the distance between adjacent buried bit lines 16 becomes narrow and parasitic capacitance ($C_B$) between adjacent buried bit lines 16 increases. Since the buried bit lines 16 are brought into contact with the body lines 14, the parasitic capacitance ($C_B$) between buried bit lines 16 is substantially the same as the capacitance between the body line 14 and the buried bit line 16. Because the distance between adjacent buried bit lines 16 becomes narrow, the parasitic capacitance ($C_B$) increases markedly. If the parasitic capacitance ($C_B$) between buried bit lines increases in this manner, the operation of a device may become impossible.

Also, in the conventional art, since the body lines 14 are formed in consideration of the height of the pillar that includes a channel region, high aspect ratio etching is required as an etching process for forming the body lines 14. Accordingly, because the trenches 13 are formed with a sufficient height (referred to as the reference symbol H) to include the height of the pillar, a concern is raised in that the body lines 14 are likely to lean.

SUMMARY

Various exemplary embodiments of the present invention are directed to a semiconductor device that may reduce the parasitic capacitance between adjacent buried bit lines, and a method for fabricating the same.

Also, various embodiments are directed to a semiconductor device that may prevent leaning of body lines due to a high aspect ratio etching process, and a method for fabricating the same.

In an exemplary embodiment of the present invention, a semiconductor device may include body lines, formed substantially perpendicular to a substrate, and having recessed sidewalls; buried bit lines, buried in the recessed sidewalls; and a barrier layer, interposed between each of the buried bit lines and each of the body lines corresponding thereto.

In another exemplary embodiment of the present invention, a semiconductor device may include a plurality of active regions separated from one another; a plurality of first trenches defined in a substrate, wherein the plurality of active regions are separated from one another by the plurality of first trenches; supporters filled in the plurality of first trenches; second trenches, each separating each of the plurality of active regions, and each having recessed sidewalls that face each other; a pair of separated buried bit lines, formed in each of the second trenches, and including a metal silicide; and a barrier layer, interposed between the pair of separated buried bit lines and each of the second trenches, and containing germanium.

In still another exemplary embodiment of the present invention, a method for fabricating a semiconductor device may include forming a pair of body lines that is separated by a trench, etching both sidewalls of a lower portion of the trench and forming recessed sidewalls that face each other, forming a barrier layer containing germanium, on the recessed sidewalls, and forming a pair of separated buried bit lines including a metal silicide, in the trench.

The forming of the recessed sidewalls may include forming spacers on sidewalls of the trench, and isotropically etching a bottom of the trench and forming the recessed sidewalls. The barrier layer may include silicon germanium. A content of germanium in the barrier layer is at least approximately 30%. The forming of the pair of separated buried bit lines may include forming a silicon-containing layer to fill the lower portion of the trench including the recessed sidewalls, etching back the silicon-containing layer to remain on the recessed sidewalls, forming a metal-containing layer that fills the trench, silicidating the silicon-containing layer through annealing, and removing the portion of the metal-containing layer, which has not reacted. The metal silicide may include a cobalt silicide.

In still another exemplary embodiment of the present invention, a method for fabricating a semiconductor device may include forming a plurality of active regions that are separated from one another by a plurality of first trenches, forming supporters that fill the first trenches, defining preliminary second trenches that bisect the plurality of active regions, etching both sidewalls of lower portions of the preliminary second trenches and defining second trenches that have recessed sidewalls facing each other, forming a barrier layer containing germanium, on the recessed sidewalls, and forming pairs of separated buried bit lines including a metal silicide, in the second trenches.

The supporters may include a dielectric material. The defining of the second trenches may include forming spacers on sidewalls of the preliminary second trenches, and isotropically etching bottoms of the preliminary second trenches and forming the recessed sidewalls. The barrier layer may include silicon germanium. A content of germanium in the barrier layer is at least approximately 30%. The forming of the pairs of separated buried bit lines may include forming a silicon-containing layer to fill the lower portions of the second trenches including the recessed sidewalls, etching back the silicon-containing layer so as to remain on the recessed sidewalls, forming a metal-containing layer that fills the second trenches, silicidating the silicon-containing layer through annealing, and removing the portion of the metal-containing layer, which has not reacted. The metal silicide may include a cobalt silicide.

DETAILED DESCRIPTION

Figure 1:
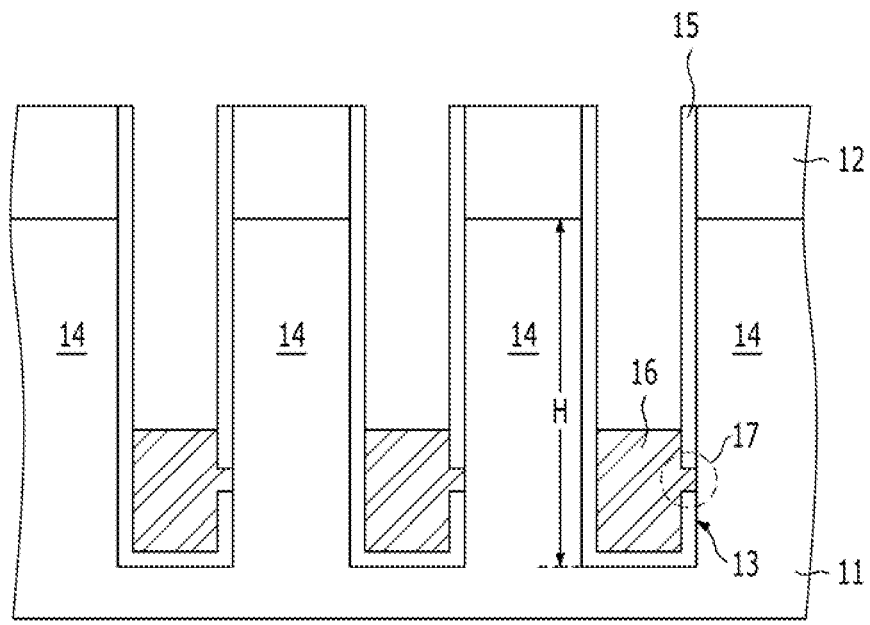
FIG. 1 is a cross-sectional view illustrating conventional buried bit lines.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

In various embodiments of the present invention that will be described below, in order to reduce parasitic capacitance ($C_B$) between adjacent buried bit lines (BBL), buried bit lines are not formed in the spaces (for example, trenches) between bodies, but are formed in the bodies. In order to form the buried bit lines in the bodies, a process scheme referred to as a BSC (both-side-contact) process or a DSC (double-side-contact) process has been suggested. The BSC process is a process where bodies each having two sidewalls are formed by etching a substrate, a sidewall passivation layer having open parts that simultaneously expose both sidewalls of the lower portions of the bodies are formed, and the bodies exposed through the open parts are silicidated, whereby buried bit lines are formed. If the buried bit lines are formed using the BSC process, since the buried bit lines are buried in the bodies, the parasitic capacitance between adjacent buried bit lines may be effectively decreased. Furthermore, as a metal silicide is applied as the material of the buried bit lines, sheet resistance (Rs) of the buried bit lines may be reduced.

However, because the BSC process is accompanied by a high aspect ratio etching process for forming the bodies, the bodies may be subject to leaning. Also, a concern is raised in that, as the metal silicide agglomerates by a thermal process performed after the process for forming the buried bit lines, the buried bit lines are likely to break. Moreover, in the BSC process, since a variation in the forming positions of the open parts inevitably occurs due to process variables, it is may not be possible to define the open parts at uniform positions, and the problem occurring due to the agglomeration of the metal silicide may be worsened.

Therefore, the following embodiments of the present invention provide a semiconductor device having supporters that may prevent body lines from leaning during a high aspect ratio etching process while buried bit lines are formed in the body lines so as to decrease the parasitic capacitance between adjacent buried bit lines, and a method for fabricating the same.

Figure 2:
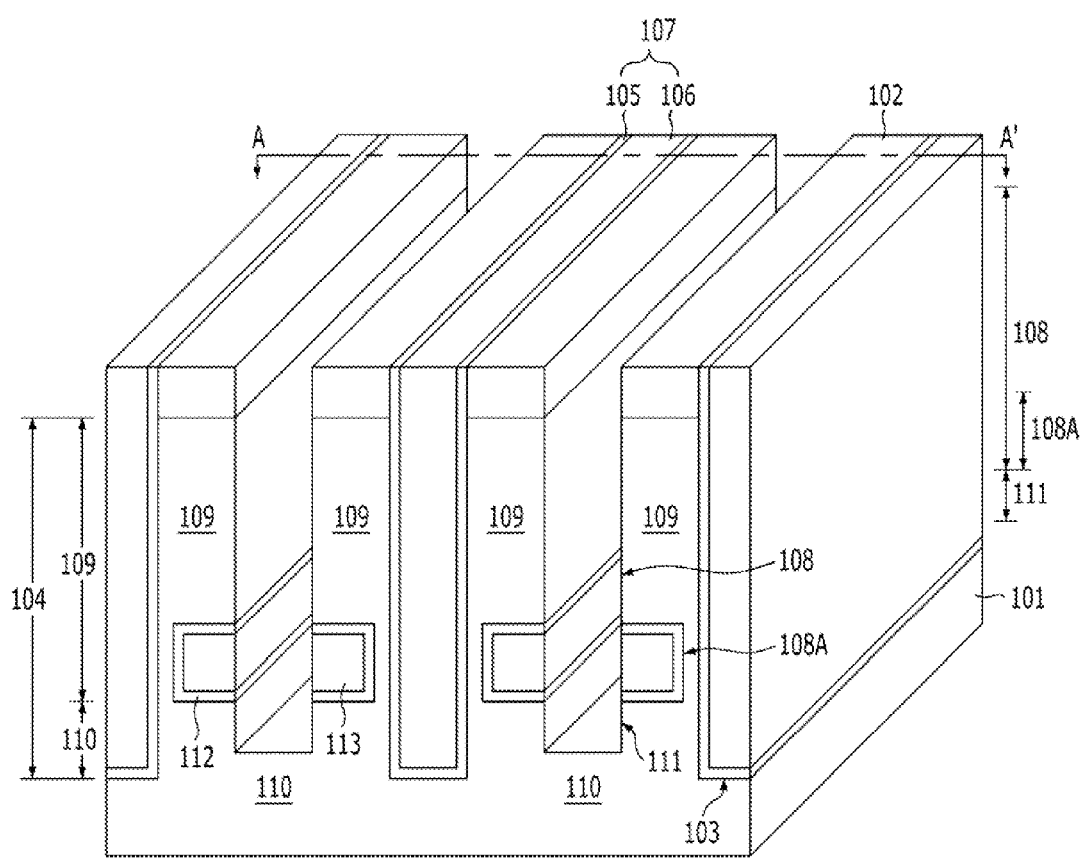
FIG. 2 is a perspective view illustrating buried bit lines in accordance with an embodiment of the present invention.

FIG. 2 is a perspective view illustrating buried bit lines in accordance with an embodiment of the present invention.

Referring to FIG. 2, a plurality of first trenches 103, which separate a plurality of active regions 104 from one another, and supporters 107, which are filled in the first trenches 103, are formed in a substrate 101. The active regions 104 that are separated by the supporters 107. Each active region 104 is formed of a body 110 and a pair of body lines 109 that are separated by a second trench 108. The second trench 108 has recessed sidewalls 108A on both sides, and buried bit lines 113 including a metal silicide are buried in the recessed sidewalls 108A on both sides. That is to say, the pair of body lines 109 respectively has the recessed sidewalls 108A that face each other, and the buried bit lines 113 are buried in the recessed sidewalls 108A. A third trench 111 is defined in the body 110 to communicate with the lower end of the second trench 108, thereby preventing the punch-through between adjacent buried bit lines 113. A barrier layer 112 containing germanium is formed between the body lines 109 and the buried bit lines 113.

The substrate 101 may have a monocrystalline state and may include a silicon-containing material. For example, the substrate 101 may include a monocrystalline silicon-containing material. In detail, the substrate 101 may include a silicon substrate or an SOI (silicon-on insulator) substrate.

The first trenches 103 may be defined by etching the substrate 101 using mask patterns 102 as etch barriers and may be line patterns that extend in one direction. Accordingly, the supporters 107 filled in the first trenches 103 may also be line patterns that extend in the one direction. The supporters 107 may have such structures that are to be filled between adjacent active regions 104. The active regions 104 that are separated by the supporters 107 may also have line patterns that extend in one direction.

The supporters 107 function to prevent the active regions 104 and the body lines 109 from leaning while performing processes, and serve as an isolation layer that isolates adjacent active regions 104 from each other. Furthermore, the supporters 107 function to decrease the parasitic capacitance between adjacent buried bit lines 113. The supporters 107 may include a dielectric material. More specifically, the supporters 107 may include a dielectric material with a low dielectric constant to effectively decrease the parasitic capacitance between adjacent buried bit lines 113. For reference, the dielectric material with a low dielectric constant means a dielectric material that has a dielectric constant lower than a silicon oxide.

The supporters 107 may be any one single layer selected from the group consisting of an oxide layer, a nitride layer and an oxynitride layer, or a stacked layer thereof. For instance, the supporters 107 may include a passivation layer 105 that is formed in a predetermined thickness on the surfaces of the first trenches 103, and a gapfill layer 106 that fills the first trenches 103 on the passivation layer 105. The gapfill layer 106 that occupies most of the supporters 107 may include a dielectric material with a low dielectric constant to decrease the parasitic capacitance between adjacent buried bit lines 113. For instance, the gapfill layer 106 may be an oxide layer. The passivation layer 105 may serve as an etch stop layer that prevents the supporters 107 from being damaged and prevents adjacent buried bit lines 113 from being short-circuited, while performing a process for forming the buried bit lines 113. For instance, the passivation layer 105 may be a nitride layer.

The second trenches 108 defined in the active regions 104 may be defined by etching the active regions 104 using the mask patterns 102 as etch barriers, and may be line patterns that extend in the one direction. The depth of the second trenches 108 measured from the upper surfaces of the mask patterns 102 may be less than the depth of the first trenches 103 in which the supporters 107 are filled.

By each second trench 108, each active region 104 may be divided into a body 110 and a pair of body lines 109 on the body 110. The body 110 means a portion of the active region 104, where the second trench 108 is not defined. The pair of body lines 109 may have a structure in which the pair of body lines 109 is connected with each other by the body 110 lying under them. The body 110 and the body lines 109 may be line patterns that extend in one direction. The second trench 108 has the recessed sidewalls 108A on both sides, and the positions of the recessed sidewalls 108A in the second trench 108 are the same with each other. In other words, the recessed sidewalls 108A face each other. As the second trench 108 has the recessed sidewalls 108A on both sides, the pair of body lines 109 respectively has the recessed sidewalls 108A. That is to say, the pair of body lines 109 that is formed in each active region 104, respectively, has the recessed sidewalls 108A that face each other.

The buried bit lines 113 may have such shapes that are to be buried in the recessed sidewalls 108A of the body lines 109. Since the buried bit lines 113 are formed in the body lines 109, the parasitic capacitance between the buried bit lines 113 may be decreased. Due to the fact that the buried bit lines 113 have such shapes that are to be buried in the recessed sidewalls 108A of the body lines 109, one pair of buried bit lines 113 that faces each other may be respectively formed in the pair of body lines 109.

The buried bit lines 113 include a metal silicide. Since the metal silicide is a material, which has lower resistance than that of (poly)silicon doped with impurities, the buried bit lines 113 have a low resistance. The buried bit lines 113 may be formed through a silicidation process. Further, the buried bit lines 113 may be formed through a full silicidation process. The full silicidation process means a process for fully silicidating a silicon-containing material. The buried bit lines 113 may be formed by using a near-noble metal such as a titanium silicide ($TiSi_x$), a tungsten silicide ($WSi_x$), a cobalt silicide ($CoSi_x$) or a nickel silicide ($NiSi_x$), or a metal silicide such as a refractory metal. The metal silicide may be obtained by forming a metal-containing layer through a sputtering process, a chemical vapor deposition (CVD) process or an atomic layer deposition (ALD) process and then performing a silicidation process. The metal-containing layer may include a near-noble metal or a refractory metal.

The third trench 111 that communicates with the lower end of the second trench 108 functions to prevent the punch-through between the pair of buried bit lines 113 that are positioned on both sides of the second trench 108. In order to prevent the body lines 109 from leaning during processes, the depth of the third trench 111 may be less than the depth of the first trench 103. Furthermore, when measured from the upper surfaces of the mask patterns 102, the sum of the depth of the second trench 108 and the depth of the third trench 111 may be less than the depth of the first trenches 103. While not shown, an interlayer dielectric layer is filled in the second trenches 108 and the third trenches 111. The interlayer dielectric layer may include a dielectric material with a low dielectric constant to decrease the parasitic capacitance between adjacent buried bit lines 113.

The barrier layer 112 interposed between the body lines 109 and the buried bit lines 113 functions to prevent the agglomeration of the buried bit lines 113 including a metal silicide. Thus, the barrier layer 112 contains a material for preventing the agglomeration of the metal silicide. In detail, the barrier layer 112 may contain germanium (Ge). For instance, the barrier layer 112 may be silicon germanium (SiGe). In order to effectively prevent the agglomeration of the metal silicide by germanium, the content of germanium in the barrier layer 112 may be at least approximately 30%. The barrier layer 112 may be formed through a deposition process or a growth process. The detailed explanations of the above processes will be made later when describing a method for fabricating the buried bit lines 113.

According to the above-described embodiment, since the buried bit lines 113 are buried in the body lines 109, it may not be necessary to form the buried bit lines 113 between the body lines 109, whereby high integration may become possible. Also, since adjacent buried bit lines 113 may be sufficiently separated from each other, the parasitic capacitance between adjacent buried bit lines 113 may be reduced.

Also, as the supporters 107 are formed, the body lines 109 may be prevented from leaning during processes.

Furthermore, since the depth of the first trenches 103 in which the supporters 107 are filled is more than the sum of the depths of the second trenches 108 and the third trenches 111, it is possible to prevent the punch-through between the buried bit lines 113 positioned on both sides of the supporters 107. In addition, the punch-through between the buried bit lines 113 positioned on both sides of the second trenches 108 may be prevented by the third trenches 111.

Also, as the barrier layer 112 that contains a material for preventing the agglomeration of the metal silicide is provided, it is possible to overcome concerns that are likely to be caused due to the agglomeration of the metal silicide. In detail, it is possible to prevent the buried bit lines 113 from breaking due to the agglomeration of the metal silicide.

Since the buried bit lines 113 according to the present embodiment have such shapes that are to be buried in the recessed sidewalls 108A of the body lines 109, it is possible to uniformly form the buried bit lines 113 at the same position. The detailed explanations of the above process will be made below when describing the method for fabricating the buried bit lines 113.

FIGS. 3A to 3L are cross-sectional views illustrating the processes of a method for fabricating buried bit lines in accordance with an embodiment of the present invention. Hereinafter, as an exemplary method for fabricating the buried bit lines shown in FIG. 2, the case where a barrier layer is formed through a deposition process will be described. FIGS. 3A to 3L are taken along the line A-A' of FIG. 2.

Figure 3A:
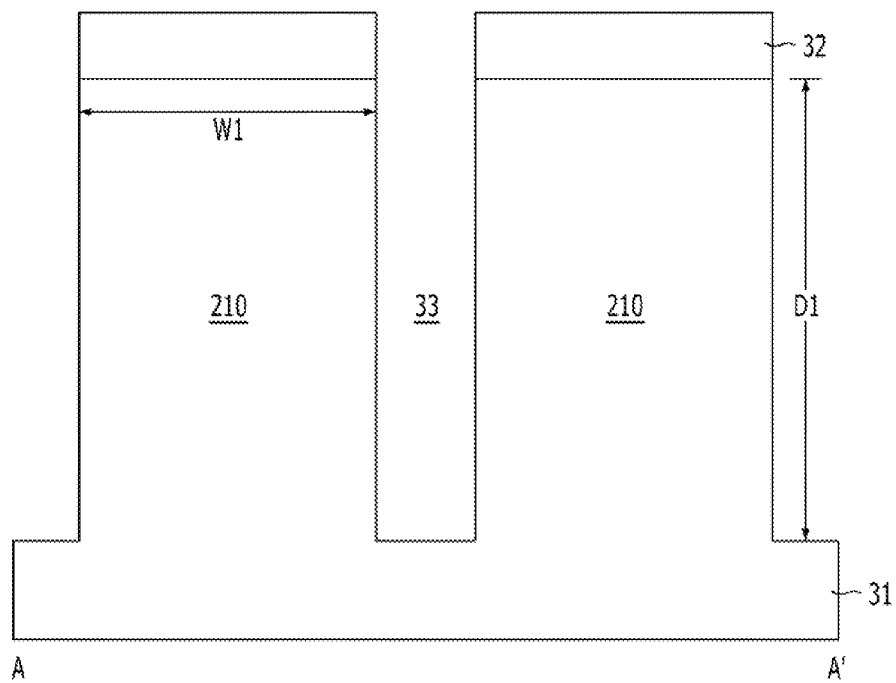
FIGS. 3A to 3L are cross-sectional views illustrating a method for fabricating buried bit lines in accordance with an embodiment of the present invention.

Referring to FIG. 3A, a substrate 31 is prepared. The substrate 31 may include a monocrystalline material. The substrate 31 may include a silicon-containing substrate. For example, the substrate 31 may include monocrystalline silicon.

First mask patterns 32 are formed on the substrate 31. The first mask patterns 32 may include a silicon nitride. The first mask patterns 32 may be a stack structure that includes a silicon oxide and a silicon nitride. For example, the first mask patterns 32 may be deposited in order of a silicon nitride and a silicon oxide. Furthermore, the first mask patterns 32 may be deposited in order of a silicon nitride, a silicon oxide, a silicon oxynitride and amorphous carbon. In the case where the silicon nitride is included, a pad oxide layer (not shown) may be additionally formed between the substrate 31 and the first mask patterns 32. The first mask patterns 32 may be formed using photoresist patterns (not shown). The first mask patterns 32 are formed to extend in one direction. The first mask patterns 32 may include line patterns that extend in the one direction.

By etching the substrate 31 using the first mask patterns 32 as etch barriers, a plurality of first trenches 33 are defined. An etching process for defining the first trenches 33 may include an anisotropic etching. As the plurality of first trenches 33 are defined, a plurality of active regions 210 are defined on the substrate 31 to be separated by the plurality of first trenches 33. The first trenches 33 may be line patterns that extend in the one direction. When viewed on the top, the active regions 210 have line shapes that are separated by the first trenches 33 and extend in the one direction. Therefore, the active regions 210 are different from island-type active regions that are generally known in the art.

In this way, the plurality of active regions 210 are separated by the first trenches 33. The active regions 210 have a first width W1 and a first depth D1. Since the first width W1 has a substantially large dimension that is controlled in consideration of two body lines and a space therebetween, which are to be formed through a subsequent process, it is possible to prevent the active regions 210 from leaning while defining the first trenches 33. In other words, even though a high aspect ratio etching process is performed to define the first trenches 33 to form the active regions 210, since the width of the active regions 210 is sufficiently large, the active regions 210 are prevented from leaning.

Figure 3B:
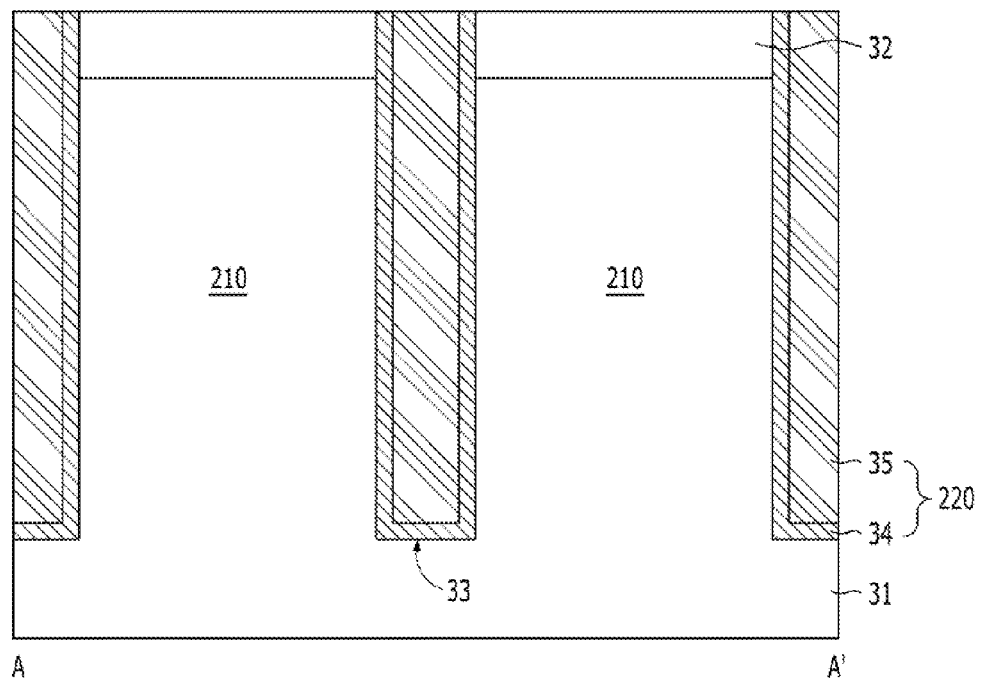

Referring to FIG. 3B, a passivation layer 34 is formed on the surface of the structure including the first trenches 33. The passivation layer 34 functions to alleviate the stress between a gapfill layer that is subsequently formed and the substrate 31. The passivation layer 34 simultaneously serves as an etch stop layer that prevents over-etching while performing a subsequent process for defining second trenches. The passivation layer 34 may include a dielectric material. For example, the passivation layer 34 may be formed as any one single layer selected from the group including an oxide layer, a nitride layer and an oxynitride layer, and a stack layer thereof. For instance, the passivation layer 34 may be formed as a nitride layer.

A gapfill layer 35 is formed on the passivation layer 34 to fill the first trenches 33. The gapfill layer 35 may include a dielectric material, for example, any one selected from the group consisting of an oxide layer, a nitride layer and an oxynitride layer. The dielectric material may include a material that has a low dielectric constant to decrease the parasitic capacitance between buried bit lines to be formed through a subsequent process. For reference, the material with a low dielectric constant means a material that has a dielectric constant lower than the dielectric constant of a silicon oxide.

A planarization process is performed until the surfaces of the first mask patterns 32 are exposed. The planarization process may be performed using chemical mechanical polishing (CMP).

By the planarization process, supporters 220, which include the passivation layer 34 formed on the surfaces of the first trenches 33 and the gapfill layer 35 for filling the first trenches 33 on the passivation layer 34, are formed. The supporters 220 have such structures that are to be filled between adjacent active regions 210. Accordingly, when forming body lines by subsequently etching the active regions 210, the body lines are securely supported, and thus, it is possible to prevent the body lines from leaning. The supporters 220 may be formed as a single layer including any one selected from the group including an oxide layer, a nitride layer and an oxynitride layer each of which has a low dielectric constant.

Figure 3C:
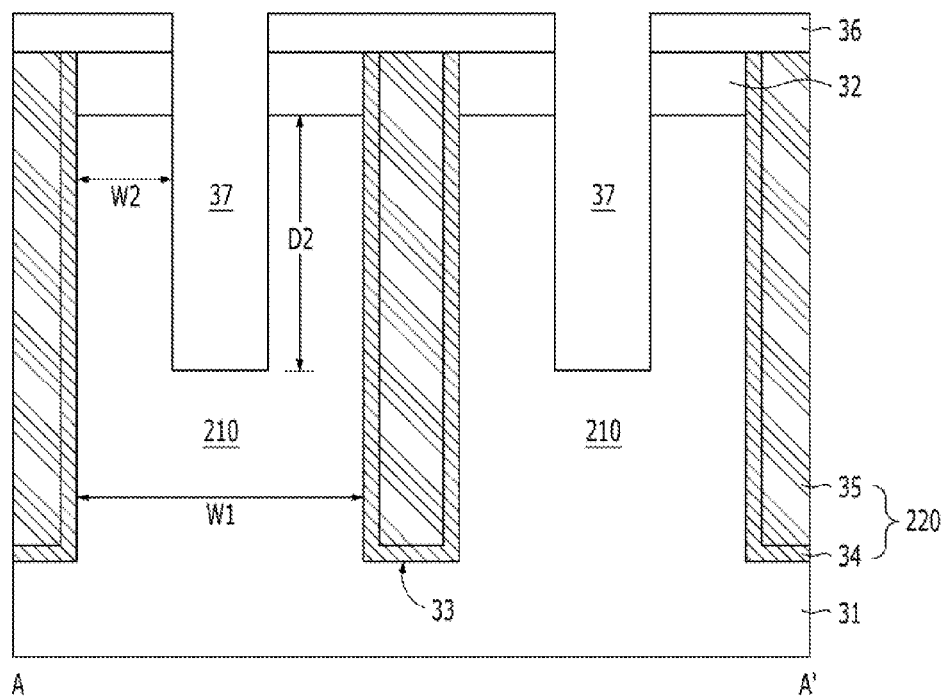

Referring to FIG. 3C, a plurality of second mask patterns 36 is formed on the supporters 220 and the first mask patterns 32. The second mask patterns 36 may include line patterns that extend in the one direction. Portions of the first mask patterns 32 are exposed through line type spaces (or openings), which are defined between adjacent second mask patterns 36. More specifically, middle portions of the respective first mask patterns 32 may be exposed through the spaces between the second mask patterns 36. In other words, the middle portions of the first mask patterns 32 are exposed through the second mask patterns 36.

In this way, the second mask patterns 36 cover at least the upper ends of the supporters 220 and have the line type spaces that are patterned to expose the middle portions of the first mask patterns 32. The second mask patterns 36 may be formed of a material that may provide an etching selectivity with respect to the first mask patterns 32. For example, the second mask patterns 36 may include amorphous carbon. A photolithography process may be employed to form the second mask patterns 36.

The first mask patterns 32 that are exposed and the active regions 210 that lie under the first mask patterns 32 are etched using the second mask patterns 36 as etch barriers. An etching process may include an anisotropic etching. According to this process, a plurality of preliminary second trenches 37 is defined. The respective preliminary second trenches 37 are defined between adjacent first trenches 33. The upper portion of each active region 210 is divided into two by each preliminary second trench 37. The preliminary second trenches 37 have a second width W2 and a second depth D2. The second width W2 may correspond to ⅓ of the first width W1 of the active regions 210. The second depth D2 may be less than the first depth D1 of the first trenches 33.

While defining the preliminary second trenches 37, since the active regions 210 are securely supported by the supporters 220, pattern leaning does not occur.

Figure 3D:
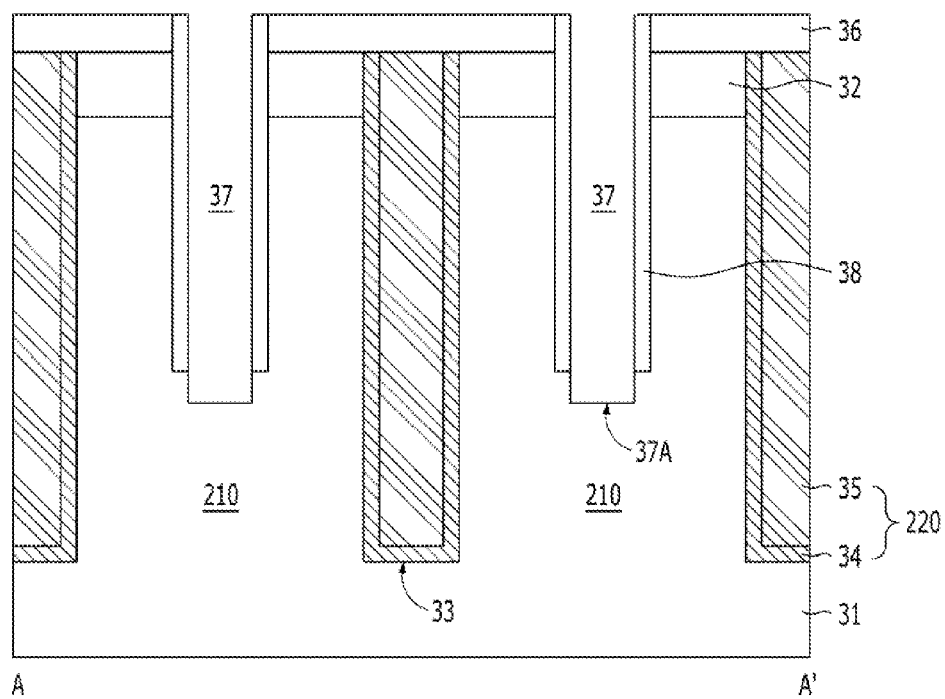

Referring to FIG. 3D, spacers 38 are formed on the sidewalls of the preliminary second trenches 37. The spacers 38 may include a nitride such as a silicon nitride. In order to form the spacers 38, a nitride with a predetermined thickness may be formed on the surface of the structure including the preliminary second trenches 37, and then, an etch-back process may be performed. The spacers 38 cover the sidewalls of the preliminary second trenches 37 and also cover both sidewalls of the first mask patterns 32 and the second mask patterns 36. In the etch-back process for forming the spacers 38, bottoms 37A of the preliminary second trenches 37 may be recessed by a preselected depth. In virtue of this process, subsequent isotropic etching may be easily performed.

Figure 3E:
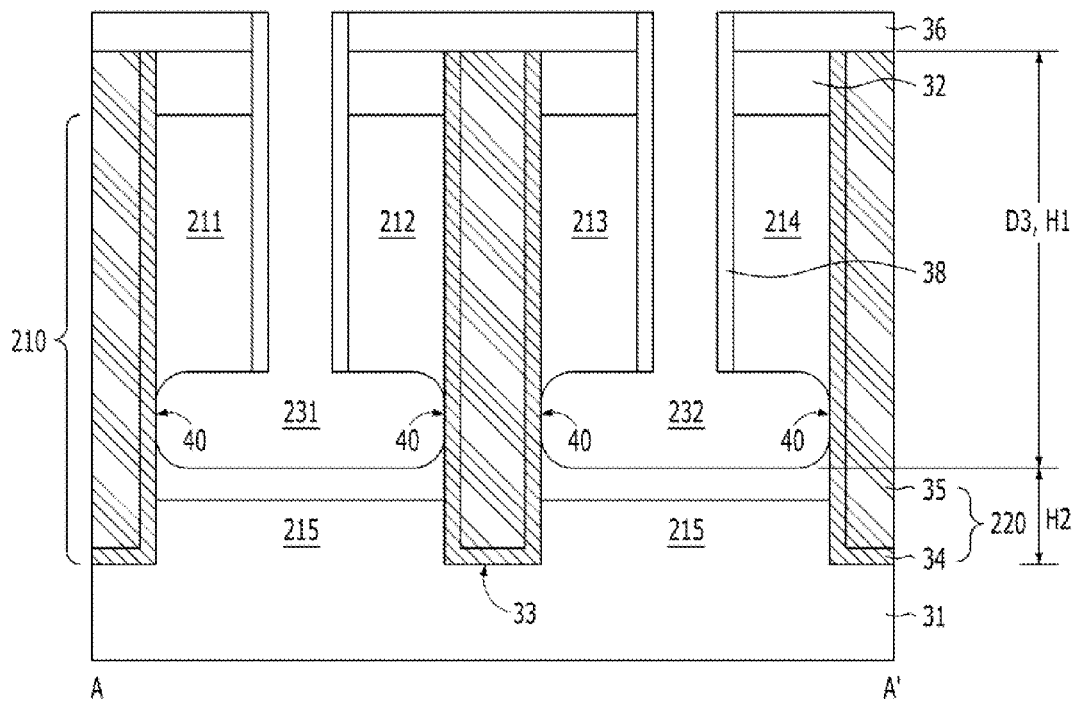

Referring to FIG. 3E, an isotropic etching is performed using the spacers 38, the first mask patterns 32 and the second mask patterns 36 as etch barriers. By the isotropic etching, the active regions 210 lying under the bottoms 37A of the preliminary second trenches 37 are selectively etched, and a plurality of second trenches 231 and 232 are defined. By defining the plurality of second trenches 231 and 232, a plurality of body lines 211, 212, 213 and 214 are formed. The second trenches 231 and 232 may have bulb type trench structures that include the preliminary second trenches 37 and recessed sidewalls 40.

By such isotropic etching, the second trenches 231 and 232 may become bulb type trenches. Therefore, the lower portions of the second trenches 231 and 232 may have curvatures. Etch amounts on the lower sidewalls of the respective body lines 211, 212, 213 and 214 may be controlled.

The bulb type second trenches 231 and 232 are defined between two adjacent first trenches 33. The plurality of body lines 211, 212, 213 and 214 are separated from one another by the second trenches 231 and 232. For example, the first body line 211 and the second body line 212 are separated by the second trench 231, and the third body line 213 and the fourth body line 214 are separated by the second trench 232. As a consequence, as the first body line 211 and the second body line 212 are paired by the second trench 231, a body line pair is formed. Also, as the third body line 213 and the fourth body line 214 are paired by the second trench 232, a body line pair is formed. The respective body line pairs may be separated from each other by the support 220. Another body line pair may be formed with the support 220 interposed between two body lines.

The second trenches 231 and 232 have a third depth D3. The third depth D3 is controlled to be less than the first depth D1 of the first trenches 33 in which the supporters 220 are filled. The respective body lines 211, 212, 213 and 214 have a height H1 that is substantially identical to the third depth D3. The respective body lines 211, 212, 213 and 214 have substantially the same width. Even though the third depth D3 of the second trenches 231 and 232 is substantially deep, the body lines 211, 212, 213 and 214 are prevented from leaning, due to the presence of the supporters 220. When viewed on the top, the plurality of body lines 211, 212, 213 and 214 are separated from one another by the second trenches 231 and 232 and extend in the one direction. The lower sidewalls of the body lines 211, 212, 213 and 214 are recessed by the second trenches 231 and 232. In other words, since the second trenches 231 and 232 are bulb type trenches, the body lines 211, 212, 213 and 214 have the recessed sidewalls 40 in shape of bulb. The recessed sidewalls 40 are formed on any one of the sidewalls of the respective body lines 211, 212, 213 and 214. The respective body lines 211, 212, 213 and 214 have first sidewalls and second sidewalls. The first sidewalls have vertical profiles, and the second sidewalls correspond to the recessed sidewalls 40. The recessed sidewalls 40 of the body lines that form a pair facing each other. The first mask patterns 32 and the second mask patterns 36 remain on the body lines 211, 212, 213 and 214. The spacers 38 remain on the sidewalls of the body lines 211 and 212 that face each other and the body lines 213 and 214 that face each other. The recessed sidewalls 40 may be non-protected sidewalls that are not protected by the spacers 38. Thus, the recessed sidewalls 40 may be referred to as recessed non-protected sidewalls.

According to the series of processes described above, each of the active regions 210 is divided into two. The plurality of body lines 211, 212, 213 and 214, which are separated by the second trenches 231 and 232, are formed. The respective body lines 211, 212, 213 and 214 have the recessed sidewalls 40. The recessed sidewalls 40 may be the lower sidewalls of the body lines 211, 212, 213 and 214. The upper sidewalls of the body lines 211, 212, 213 and 214 are protected by the spacers 38. According to the height of the spacers 38, the heights of the upper sidewalls and the lower sidewalls of the body lines 211, 212, 213 and 214 may be controlled. The lower sidewalls of the body lines 211, 212, 213 and 214 mean the non-protected sidewalls that are exposed out of the spacers 38. Bodies 215 with a predetermined height H2 may remain under the body lines 211, 212, 213 and 214. The bodies 215 are formed on the substrate 31. The body lines 211, 212, 213 and 214 are formed substantially perpendicular to the bodies 215. Two body lines may be formed on each body 215. Adjacent bodies 215 are separated from each other by the first trenches 33.

Figure 3F:
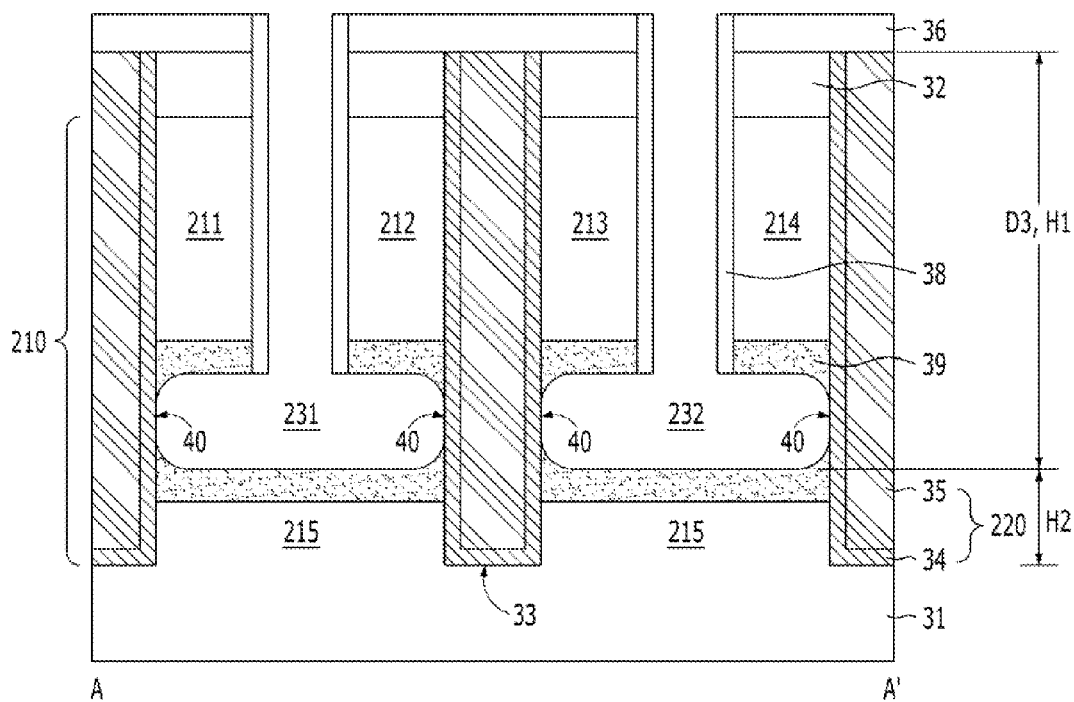

Referring to FIG. 3F, a plasma doping is performed. At this time, as impurities are doped into the active regions 210 that are exposed through the recessed sidewalls 40 of the second trenches 231 and 232, first source/drain regions 39 are formed. The first source/drain regions 39 serve as the source regions or the drain regions for vertical channel transistors.

The plasma doping is a method in which a doping source (that is, impurities) is excited to a plasma state and dopant ions in the excited plasma are implanted into a target object. By supplying a bias voltage to the target object, the dopant ions in the plasma may be doped all at once to the entire surface of the target object. The bias energy is also referred to as doping energy. The plasma doping is performed using doping energy, a doping dose and a doping source. The doping source is a material that contains a dopant to be doped to the first source/drain regions 39. The doping source includes a dopant gas. The doping source uses a dopant gas containing arsenic (As), phosphorus (P), and so forth. For example, the doping source includes $AsH_3$ or $PH_3$. Arsenic (As) and phosphorus (P) are known as N-type dopants. Also, as the doping source, a dopant gas containing boron (B) may be used. Boron is known as a P-type dopant. The doping energy is a bias voltage applied to the substrate 31. The doping dose indicates an implantation amount of the dopant. The doping dose is set to from approximately $1\times10^{15}$ to approximately $1\times10^{17}$ atoms/cm$^2$. By performing the plasma doping using the doping dose with such a range, the dopant doped to the first source/drain regions 39 has a doping concentration equal to or greater than approximately $1\times10^{20}$ atoms/cm$^3$. For the plasma doping, a gas to excite plasma may flow. The gas to excite plasma includes argon (Ar), helium (He), etc.

As described above, since the plasma doping may be performed without a tilt angle, the doping is possible without experiencing a shadow effect by a surrounding structure. In virtue of this doping process, the first source/drain regions 39 may be formed at desired positions.

As another method for forming the first source/drain regions 39, doped polysilicon in situ doped with a dopant may be used. For example, by performing annealing after filling the doped polysilicon into the second trenches 231 and 232, the dopant in the doped polysilicon may be diffused to the active regions 210.

Figure 3G:
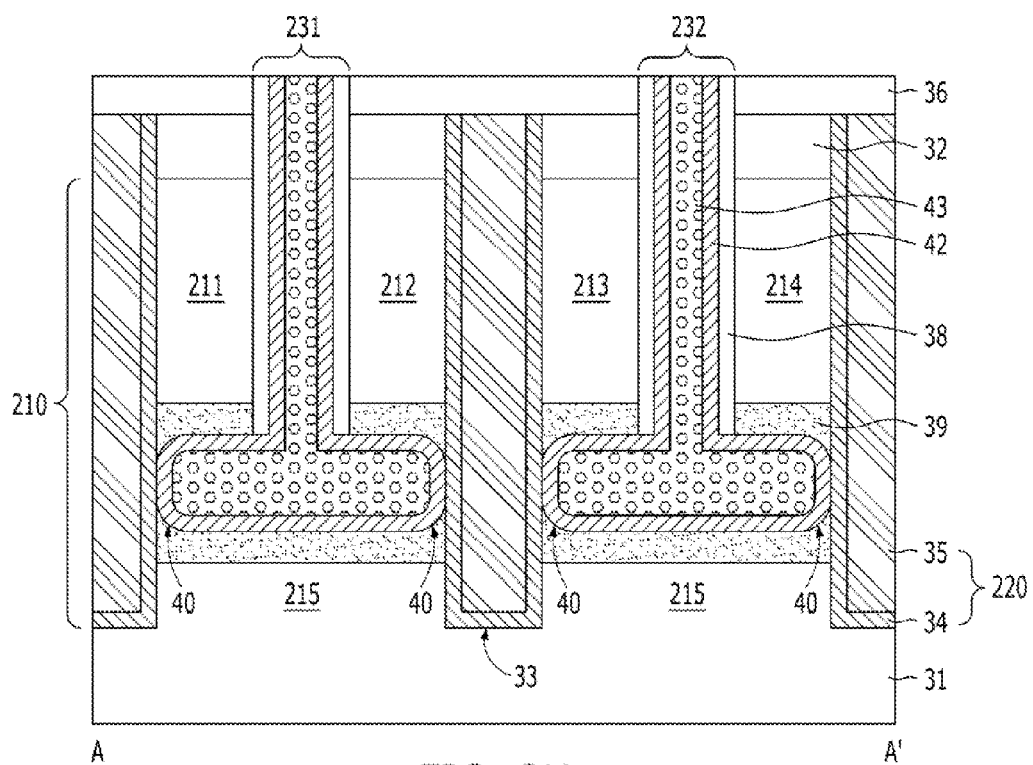

Referring to FIG. 3G, a barrier layer 42 is formed on the surface of the structure including the second trenches 231 and 232. The barrier layer 42 may be formed using an atomic layer deposition method. The barrier layer 42 may be formed on the surface of the structure including the second trenches 231 and 232 to have a predetermined thickness. The barrier layer 42 functions to prevent a metal silicide from being formed at an undesired region while subsequently performing a process for forming buried bit lines including a metal silicide. Also, the barrier layer 42 functions to prevent the metal silicide from agglomerating. Consequently, the barrier layer 42 includes a material that prevents the silicidation reaction of a silicon-containing material and prevents the agglomeration of the metal silicide. In detail, the barrier layer 42 may include germanium. For instance, the barrier layer 42 may be formed of silicon germanium (SiGe). In order to effectively prevent the agglomeration of the metal silicide, the content (or concentration) of germanium in silicon germanium may be at least approximately 30%.

A silicon-containing layer 43 is formed on the barrier layer 42 to fill the second trenches 231 and 232. The silicon-containing layer 43 may be formed as a polysilicon layer. The silicon-containing layer 43 functions to provide a silicon source in a subsequent silicidation process for forming the metal silicide.

A planarization process is performed until the surfaces of the second mask patterns 36 are exposed. The planarization process may be performed through chemical mechanical polishing (CMP) or etch-back.

Figure 3H:
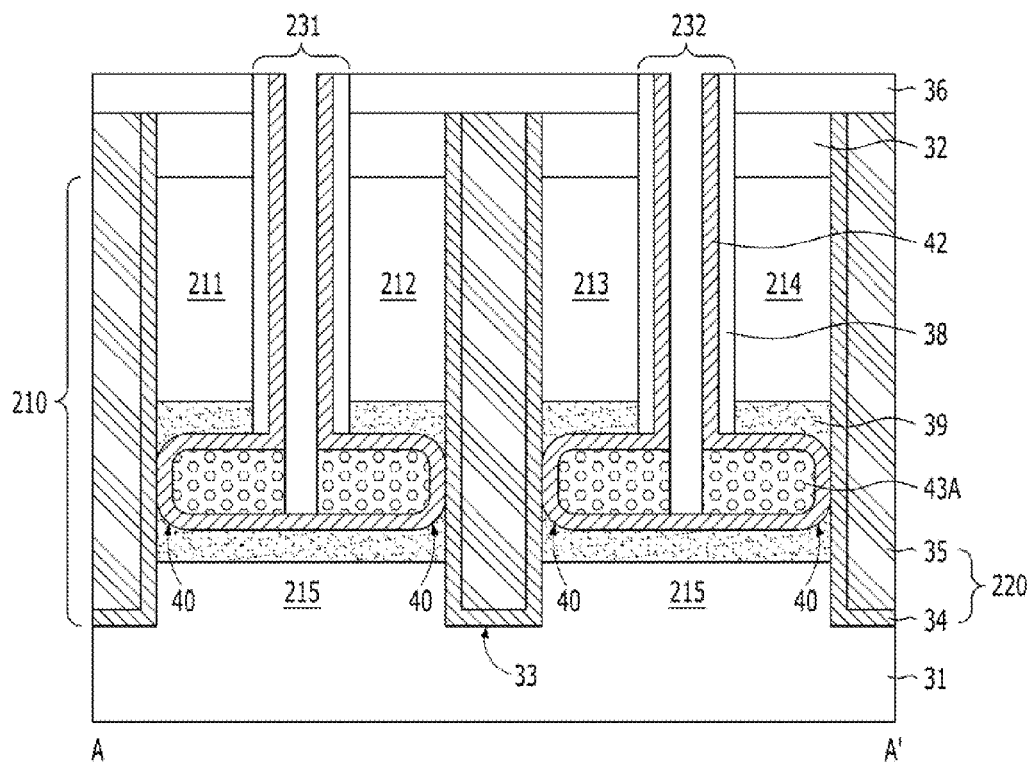

Referring to FIG. 3H, by etching the silicon-containing layer 43 using the first mask patterns 32, the second mask patterns 36, the spacers 38 and the barrier layer 42 as etch barriers, the silicon-containing layer 43 in the second trenches 231 and 232 is bisected. The bisected silicon-containing layer 43 may have such shapes that are to be buried in the recessed sidewalls 40 of the body lines 211, 212, 213 and 214. Hereinafter, the bisected silicon-containing layer 43 will be designated by the reference numeral 43A.

Figure 3I:
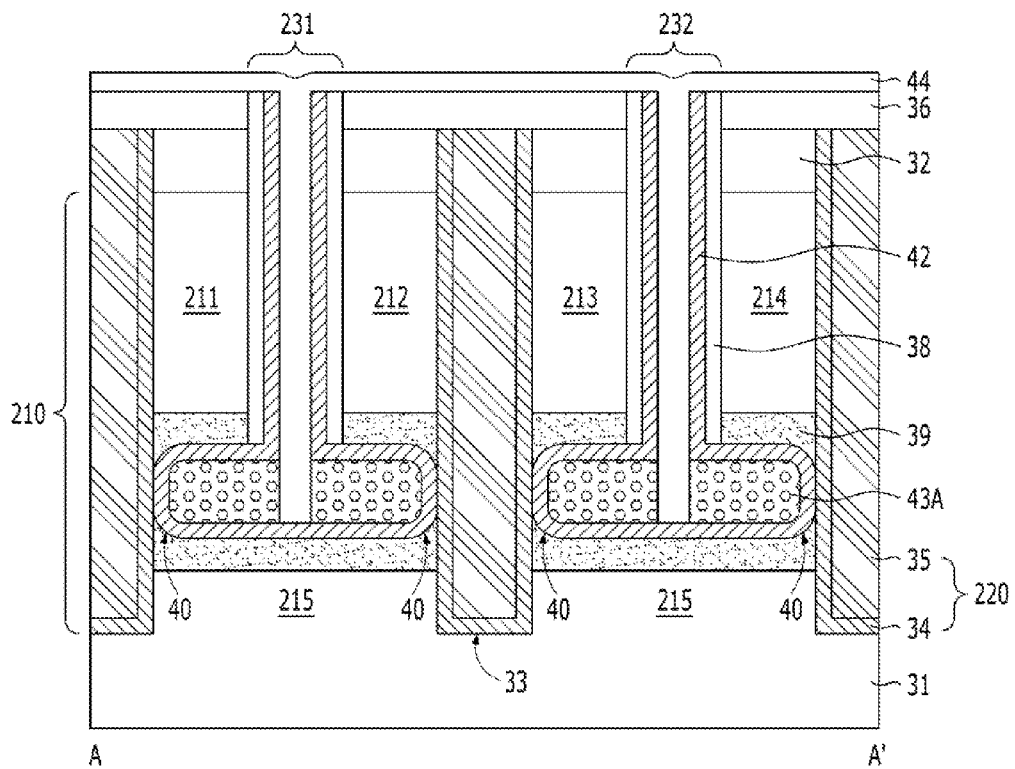

Referring to FIG. 3I, a metal-containing layer 44 is formed on the entire surface to fill the second trenches 231 and 232 including the bisected silicon-containing layer 43A. The metal-containing layer 44 may include a metal such as a near-noble metal and a refractory metal. For example, the metal-containing layer 44 includes any one selected among cobalt (Co), titanium (Ti), tantalum (Ta), nickel (Ni), tungsten (W), platinum (Pt) and palladium (Pd). The metal-containing layer 44 is formed through chemical vapor deposition (CVD) or atomic layer deposition (ALD).

Figure 3J:
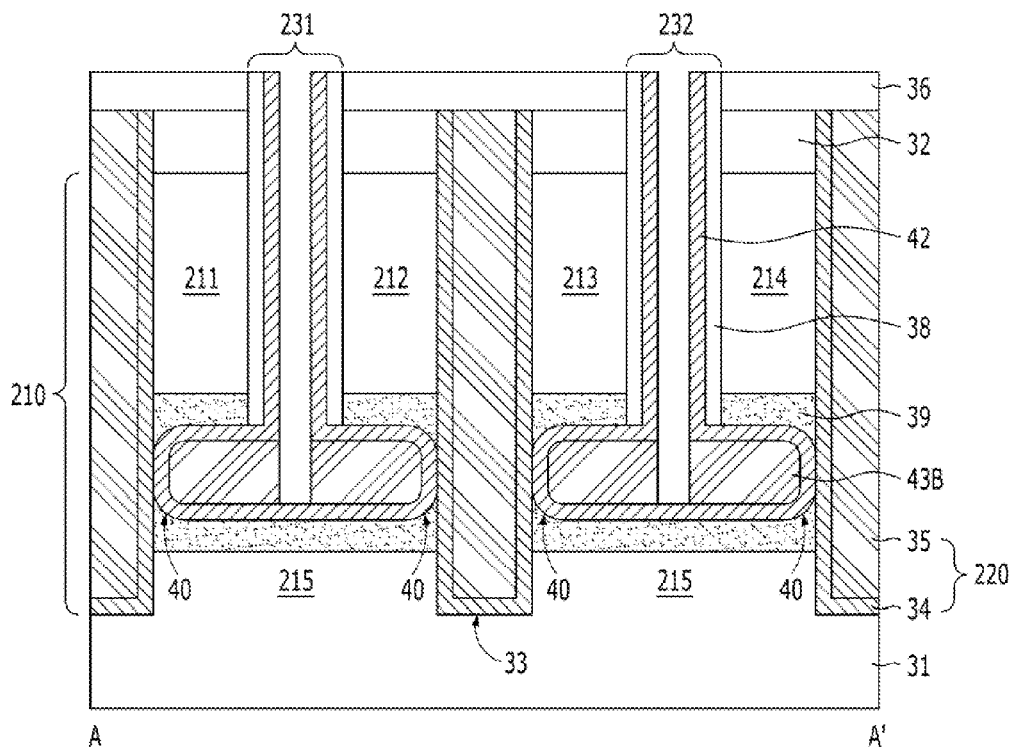

Referring to FIG. 3J, the silicidation process is performed through annealing, such that the metal-containing layer 44 and the silicon-containing layer 43 react with each other. By this process, the silicon-containing layer 43 is converted into a metal silicide layer 43B. The metal silicide layer 43B may include any one selected among a cobalt silicide, a titanium silicide, a tantalum silicide, a nickel silicide, a tungsten silicide, a platinum silicide and a palladium silicide.

The annealing for forming the metal silicide layer 43B may be rapid thermal annealing (RTA), and may be performed a multitude of times at different temperature ranges. The rapid thermal annealing (RTA) may be performed at different temperatures depending upon the kinds (or the materials) of the silicon-containing layer 43A and the metal-containing layer 44. For example, when the metal-containing layer 44 is formed using cobalt (Co), an annealing temperature may be in the range from approximately 400° C. to approximately 800° C. Also, when the metal-containing layer 44 is formed using cobalt, in order to form a cobalt silicide, rapid thermal annealing (RTA) may be performed at least twice. For example, primary annealing and secondary annealing are performed. The primary annealing is performed at a temperature from approximately 400° C. to approximately 600° C., and the secondary annealing is performed at a temperature from approximately 600° C. to approximately 800° C. By the primary annealing, a cobalt silicide with the phase of $CoSi_x$ (x=0.1~1.5) is formed. By the secondary annealing, a cobalt silicide with the phase of $CoSi_2$ is obtained. Among cobalt silicides, the cobalt silicide with the phase of $CoSi_2$ has the smallest specific resistance.

The metal silicide 43B may be formed to have a fully silicidated (FUSI) structure. That is to say, by sufficiently performing silicidation, the silicon-containing layer 43A is fully silicidated. Through full silicidation, the metal silicide layer 43B is formed in the body lines 211, 212, 213 and 214.

In the silicidation process, because the barrier layer 42 includes a dopant for preventing the silicidation of a silicon-containing material, that is, germanium, the metal silicide is not formed at regions excluding the silicon-containing layer 43A.

The non-reacted metal-containing layer 44 that remains after forming the metal silicide 43B is removed. The non-reacted metal-containing layer 44 may be removed through wet etching. For instance, the non-reacted metal-containing layer may be removed using a mixture of sulphuric acid ($H_2SO_4$) and hydrogen peroxide ($H_2O_2$).

Figure 3K:
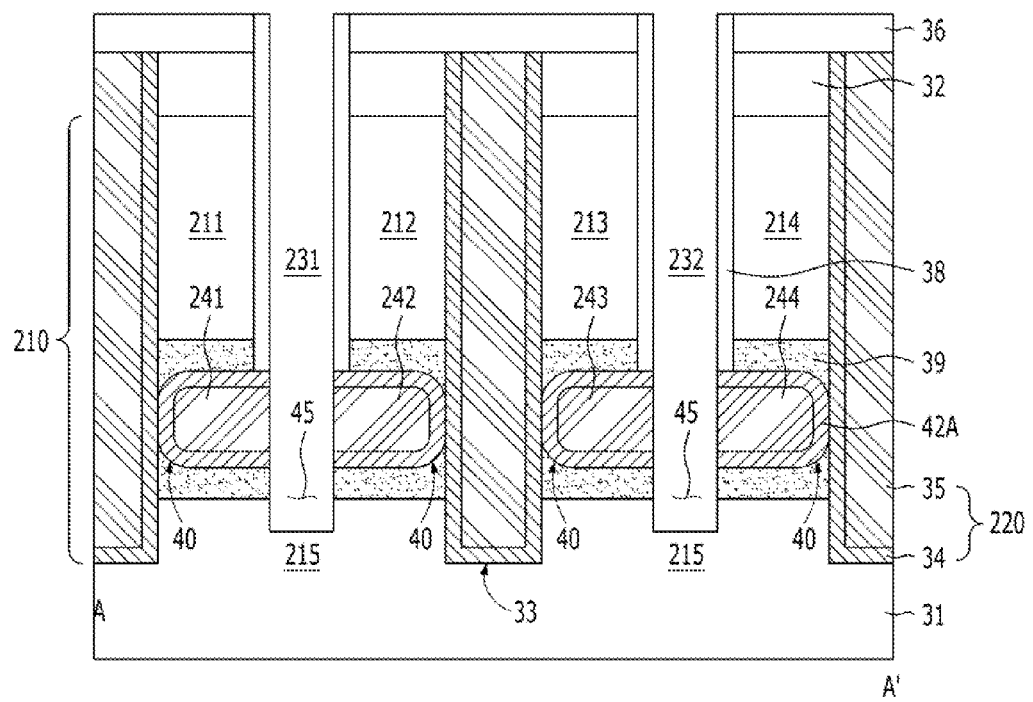

Referring to FIG. 3K, the barrier layer 42 is etched using the first mask patterns 32, the second mask patterns 36 and the spacers 38 as etch barriers, until the bottoms of the second trenches 231 and 232 are exposed. At this time, the metal silicide layer 43B may also be partially etched. Hereinafter, the etched barrier layer 42 will be designated by the reference numeral 42A.

By this fact, a plurality of buried bit lines 241, 242, 243 and 244, which have such shapes that are to be buried in the recessed sidewalls 40 of the body lines 211, 212, 213 and 214 and include the metal silicide layer, are formed. The barrier layer 42A has such shapes that are to be interposed between the buried bit lines 241, 242, 243 and 244 and the body lines 211, 212, 213 and 214. The buried bit lines 241, 242, 243 and 244 may be formed in such a way as to be separated from one another in the second trenches 231 and 232. Since the recessed sidewalls 40 of the second trenches 231 and 232 have structures corresponding to the recessed sidewalls 40 of the body lines 211, 212, 213 and 214, the buried bit lines 241, 242, 243 and 244 may have such structures that are to be filled in the recessed sidewalls 40 of the body lines 211, 212, 213 and 214. For example, the first buried bit line 241 and the second buried bit line 242 are separately formed in the second trench 231, and the third buried bit line 243 and the fourth buried bit line 244 are separately formed in the second trench 232. The first buried bit line 241 and the second buried bit line 242 that face each other may form a pair, and the third buried bit line 243 and the fourth buried bit line 244 that face each other may form a pair. The second buried bit line 242 and the third buried bit line 243 may be separated by the support 220.

By partially etching the bodies 215 lying under the bottoms of the second trenches 231 and 232 using the first mask patterns 32, the second mask patterns 36 and the spacers 38 as etch barriers, third trenches 45 are defined. The third trenches 45 function to prevent the punch-through between adjacent buried bit lines 241/242 and 243/244. In detail, by the third trenches 45, it is possible to prevent the punch-through between the first buried bit line 241 and the second buried bit line 242 and the punch-through between the third buried bit line 243 and the fourth buried bit line 244. In order to effectively prevent the punch-through between adjacent buried bit lines 241/242 and 243/244, the bottoms of the third trenches 45 may be lower than the bottoms of the first source/drain regions 39 and may be higher than the bottoms of the first trenches 33.

Figure 3L:
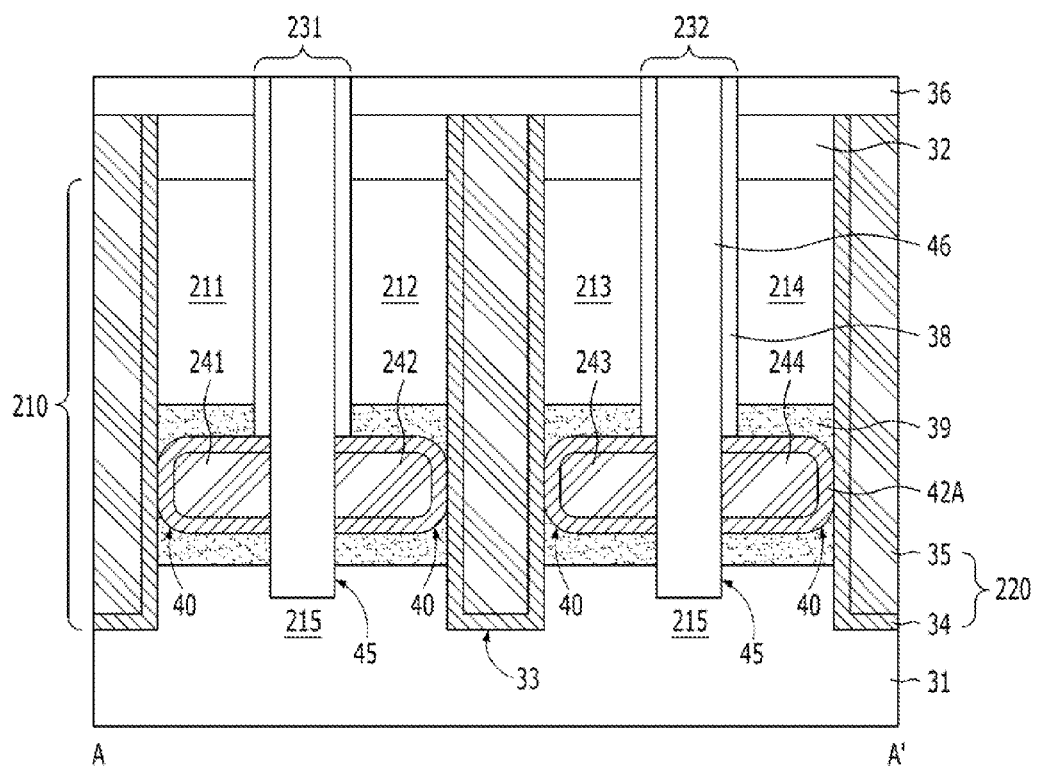

Referring to FIG. 3L, an interlayer dielectric layer 46 is formed to fill the second trenches 231 and 232 and the third trenches 45. The interlayer dielectric layer 46 may include an oxide such as BPSG (boron phosphorus silicate glass). The interlayer dielectric layer 46 may include a first interlayer dielectric layer (not shown) and a second interlayer dielectric layer (not shown). For example, after depositing the first interlayer dielectric layer in the form of a liner layer, the second trenches 231 and 232 and the third trenches 45 may be filled using the second interlayer dielectric layer. The interlayer dielectric layer 46 may include a dielectric material with a low dielectric constant to decrease the parasitic capacitance between adjacent buried bit lines 241/242 and 243/244. By the interlayer dielectric layer 46, the first buried bit line 241 and the second buried bit line 242 may be isolated from each other, and the third buried bit line 243 and the fourth buried bit line 244 may be isolated from each other.

According to the embodiment of the present invention, described above, the buried bit lines 241, 242, 243 and 244 are formed in the body lines 211, 212, 213 and 214, which are separated by the second trenches 231 and 232. Moreover, the buried bit lines 241, 242, 243 and 244 may be formed in the second trenches 231 and 232 to define structures which form pairs. Therefore, adjacent buried bit lines 241/242 and 243/244 have a sufficient separation distance, and the parasitic capacitance ($C_B$) between the adjacent buried bit lines 241/242 and 243/244 is decreased.

Since the supporters 220 are formed between the buried bit lines 241, 242, 243 and 244, the punch-through between the buried bit lines 241, 242, 243 and 244 may be prevented. In addition, because the depth of the first trenches 33 in which the supporters 220 are filled is more than the depth of the second trenches 231 and 232 in which the buried bit lines 241, 242, 243 and 244 are buried, the punch-through between the buried bit lines 241, 242, 243 and 244 may be further prevented. Also, the punch-through between the buried bit lines 241, 242, 243 and 244, which are adjacent to each other with the interlayer dielectric layer 46 interposed therebetween, may be prevented by the third trenches 45.

The body lines 211, 212, 213 and 214 are firmly supported by the supporters 220. Thus, the body lines 211, 212, 213 and 214 may be structurally stable.

Vertical channel transistors including pillars may be formed on the body lines 211, 212, 213 and 214. In the present embodiment, by etching portions of the body lines 211, 212, 213 and 214, the pillars may be formed.

Since the barrier layer 42A containing a material for preventing the agglomeration of the metal silicide is interposed between the buried bit lines 241, 242, 243 and 244 including the metal silicide and the body lines 211, 212, 213 and 214, a concern likely to be raised due to the agglomeration of the metal silicide, for example, breakage of the buried bit lines 241, 242, 243 and 244, may be overcome.

As the sidewalls of adjacent body lines 211, 212, 213 and 214 are simultaneously recessed through isotropic etching and the buried bit lines 241, 242, 243 and 244 are buried in the recessed sidewalls 40, it is possible to uniformly form the buried bit lines 241, 242, 243 and 244 at the same position. Furthermore, since a separate process for forming open parts to form the buried bit lines 241, 242, 243 and 244 is not needed, processing difficulty may be decreased.

FIGS. 4A to 4E are cross-sectional views illustrating the processes of a method for fabricating buried bit lines in accordance with an embodiment of the present invention. Herein, as an exemplary method for fabricating the buried bit lines shown in FIG. 2, the case where a barrier layer is formed through a growth process will be described. FIGS. 4A to 4E are taken along the line A-A' of FIG. 2. Also, for the sake of convenience in explanation, the same reference numerals will be used to designate the same component elements as shown in FIGS. 3A to 3L, and the detailed descriptions thereof will be omitted herein.

Figure 4A:
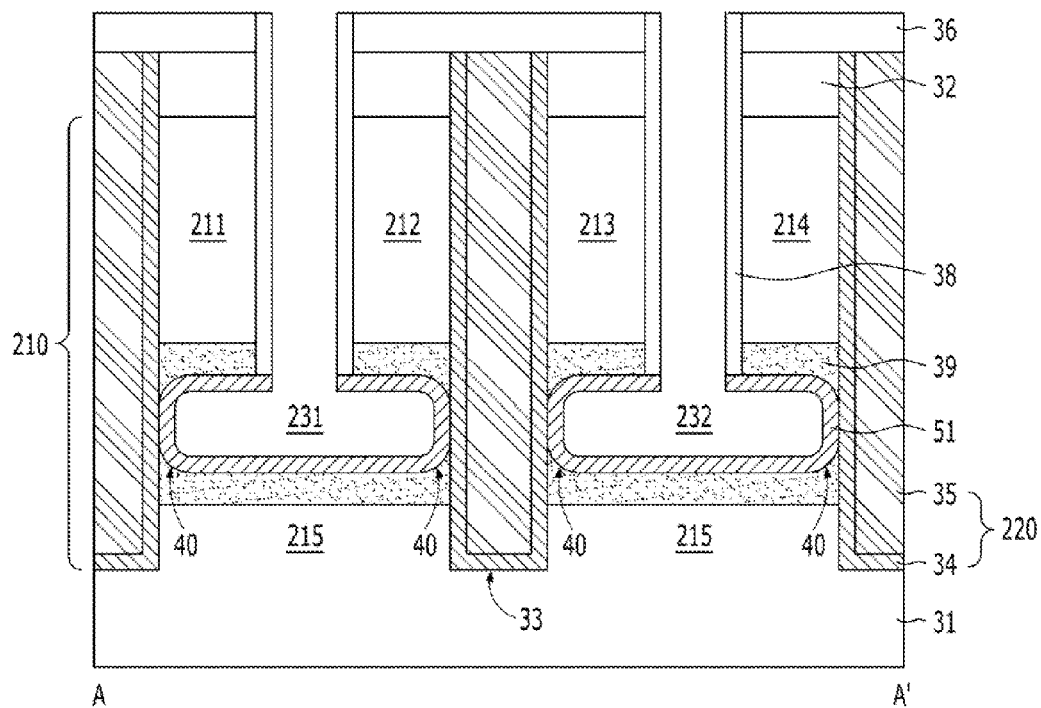
FIGS. 4A to 4E are cross-sectional views illustrating f a method for fabricating buried bit lines in accordance with an embodiment of the present invention.

Referring to FIG. 4A, a plurality of active regions 210 that are formed to be separated by first trenches 33 in which supporters 220 are filled, bulb type second trenches 231 and 232 that are defined in the active regions 210 in such a way as to separate a plurality of body lines 211, 212, 213 and 214, and first source/drain regions 39 are formed. These components may be formed using the same processing method as shown in FIGS. 3A to 3F.

A barrier layer 51 is formed through a growth process on the surfaces of the second trenches 231 and 232, which are not protected by spacers 38. Since the barrier layer 51 is grown using the substrate 31 with an exposed surface as a seed due to the characteristic of the growth process, the barrier layer 51 may be selectively formed only on the surfaces of the second trenches 231 and 232, which are not protected by the spacers 38.

The barrier layer 51 functions to prevent a metal silicide from being formed at an undesired region while subsequently performing a process for forming buried bit lines including a metal silicide and prevent the metal silicide from agglomerating. Consequently, the barrier layer 51 includes a material that prevents the silicidation reaction of a silicon-containing material and prevents the agglomeration of the metal silicide. In detail, the barrier layer 51 may include germanium. For instance, the barrier layer 51 may be formed of silicon germanium (SiGe). In order to effectively prevent the agglomeration of the metal silicide, the content (or concentration) of germanium in silicon germanium may be at least approximately 30%. Silicon germanium formed through the growth process may be in a monocrystalline state.

Figure 4B:
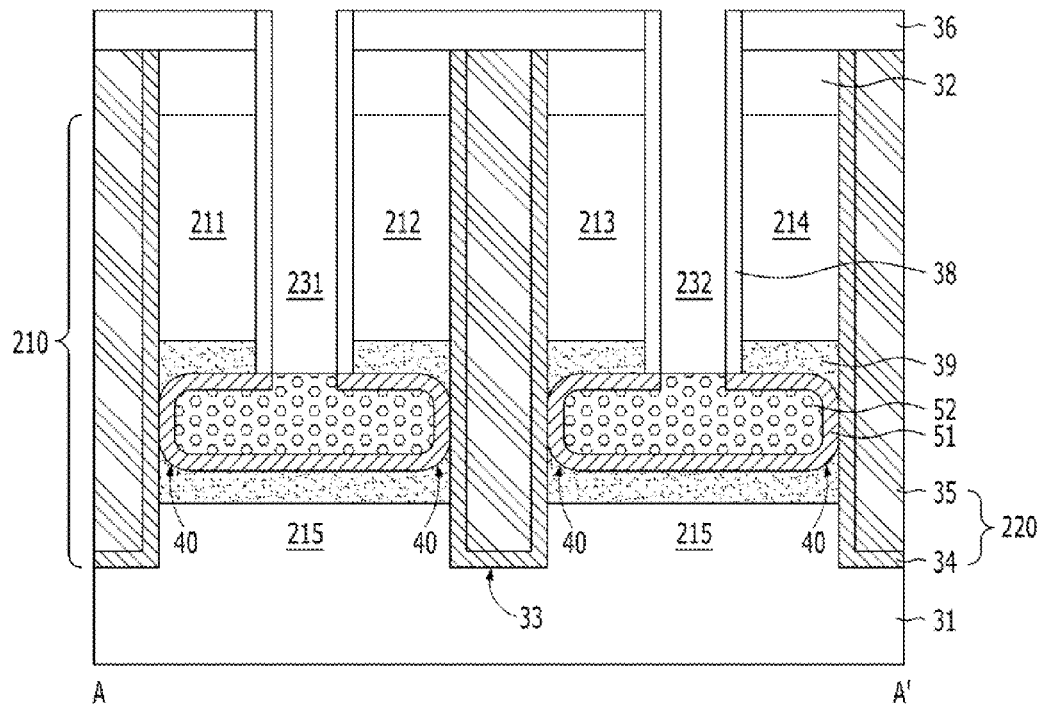

Referring to FIG. 4B, a silicon-containing layer 52 is formed on the barrier layer 51 to fill the lower portions of the second trenches 231 and 232 that include recessed sidewalls 40 of the second trenches 231 and 232. The silicon-containing layer 52 which is filled in the lower portions of the second trenches 231 and 232 may be formed through growth using the barrier layer 51 as a seed. Accordingly, the silicon-containing layer 52 may be a monocrystalline silicon-containing layer. The silicon-containing layer 52 may function to provide a silicon source in a subsequent silicidation process for forming the metal silicide.

When the barrier layer 51 and the silicon-containing layer 52 are formed through the growth processes in these ways, processes may be simplified in comparison with a method for forming them through deposition processes.

Figure 4C:
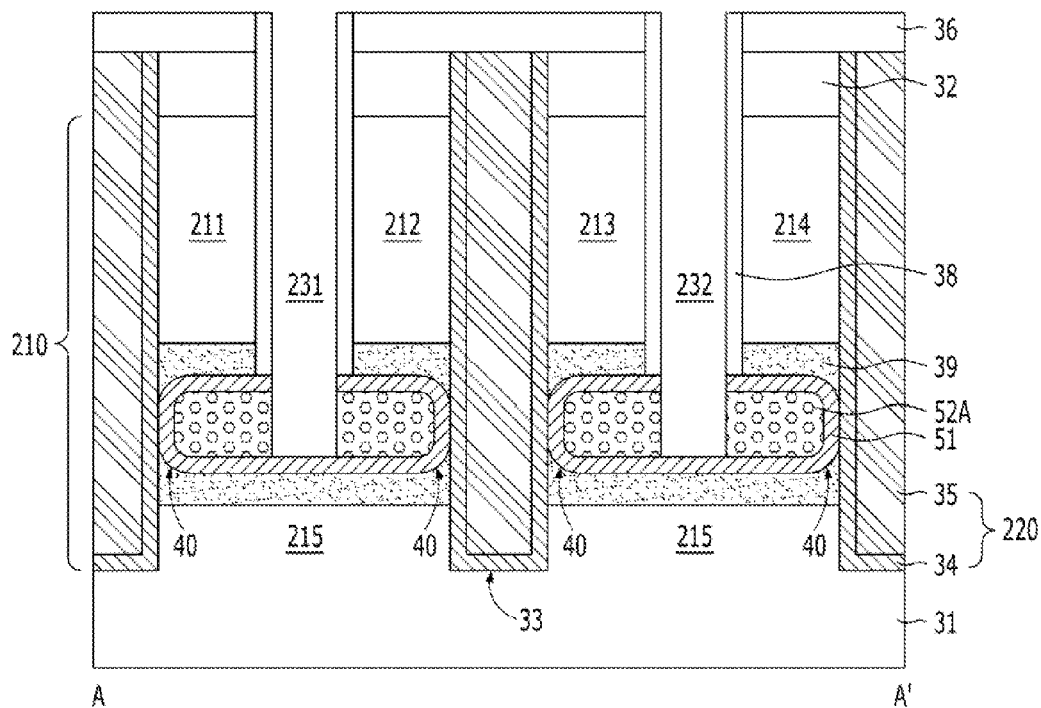

Referring to FIG. 4C, by etching the silicon-containing layer 52 using first mask patterns 32, second mask patterns 36 and the spacers 38 as etch barriers, the silicon-containing layer 52 in the second trenches 231 and 232 is bisected. The etching is controlled to stop at the barrier layer 51 formed on the bottoms of the second trenches 231 and 232. The bisected silicon-containing layer 52 may have such shapes that are to be buried in the recessed sidewalls 40 of the body lines 211, 212, 213 and 214. Hereinafter, the bisected silicon-containing layer 52 will be designated by the reference numeral 52A.

Figure 4D:
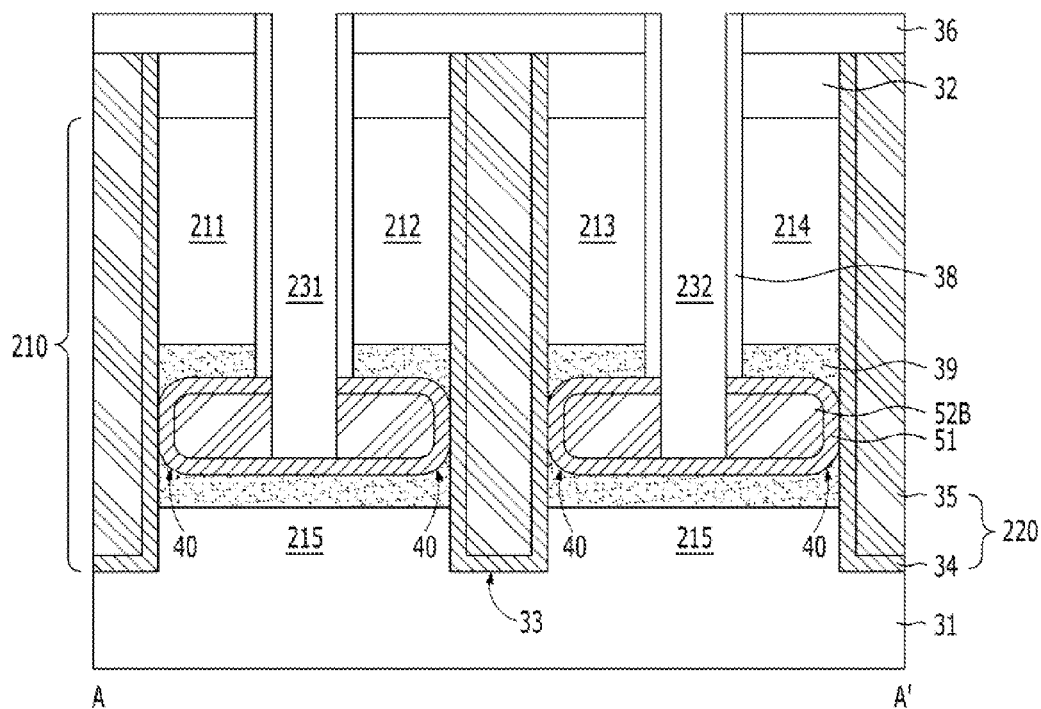

Referring to FIG. 4D, a metal silicide layer 52B is formed through a series of processing procedures of fully silicidating the silicon-containing layer 52A by performing annealing after filling a metal-containing layer in the second trenches 232 and 232 including the bisected silicon-containing layer 52A and then removing the non-reacted metal-containing layer. Since a method for forming a metal silicide is described above with reference to FIGS. 31 to 33, detailed descriptions thereof will be omitted herein.

Figure 4E:
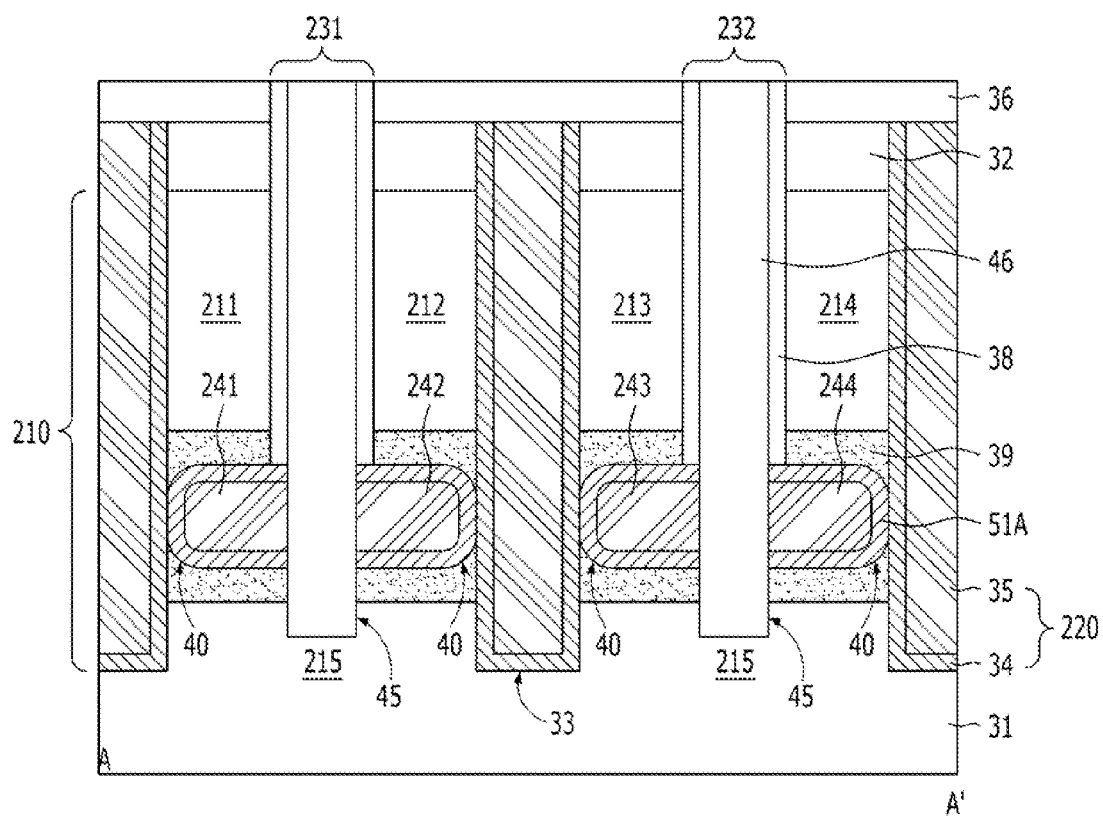

Referring to FIG. 4E, by etching the barrier layer 51 using the first mask patterns 32, the second mask patterns 36 and the spacers 38 as etch barriers until the bottoms of the second trenches 231 and 232 are exposed, and then by partially etching the bodies 215 lying under the bottoms of the second trenches 231 and 232, third trenches 45 are defined. As a result, a plurality of buried bit lines 241, 242, 243 and 244, which have shapes buried in the recessed sidewalls 40 of the body lines 211, 212, 213 and 214 and include the metal silicide layer, are formed. The barrier layer 51A has such shapes that are to be interposed between the buried bit lines 241, 242, 243 and 244 and the body lines 211, 212, 213 and 214.

An interlayer dielectric layer 46 is formed to fill the second trenches 231 and 232 and the third trenches 45. The interlayer dielectric layer 46 may include an oxide such as BPSG.

According to the present embodiment, as the barrier layer 51A and the silicon-containing layer 52 for forming the metal silicide are formed through the growth processes, processing procedures may be simplified in comparison with a method for forming the barrier layer 51A and the silicon-containing layer 52 through deposition processes.

Figure 5:
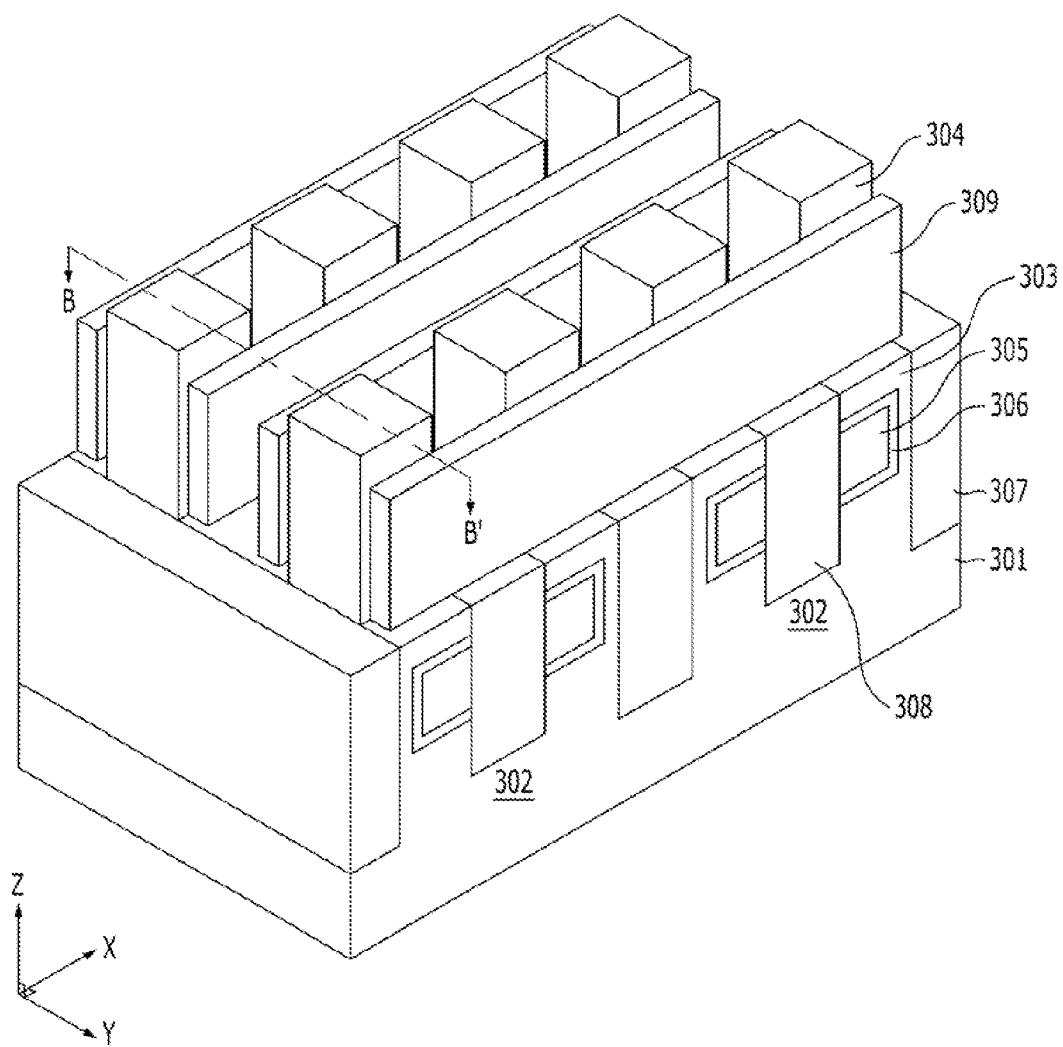
FIG. 5 is a perspective view illustrating a semiconductor device having buried bit lines in accordance with an embodiment of the present invention.

FIG. 5 is a perspective view illustrating a semiconductor device having buried bit lines in accordance with an embodiment of the present invention.

Referring to FIG. 5, a semiconductor device includes buried bit lines 305, pillars 304, and word lines 309. A plurality of active regions with, which have vertical structures including bodies 302, body lines 303 and the pillars 304, are formed on a substrate 301. Supporters 307 are filled between the plurality of active regions. The buried bit lines 305 have such structures that are to be buried in the body lines 303. The word lines 309 extend in a first direction X, and the buried bit lines 305 extend in a second direction Y. The active regions may extend in a third direction Z that is perpendicular to the substrate 301.

The substrate 301 may include a silicon-containing material. The substrate 301 may include a monocrystalline silicon substrate. The bodies 302, the body lines 303, the pillars 304 and the substrate 301 may include the same material. Accordingly, the bodies 302, the body lines 303 and the pillars 304 include the silicon-containing material. The bodies 302, the body lines 303 and the pillars 304 include monocrystalline silicon.

Each active region includes a body 302, a pair of body lines 303 that are formed on the body 302, and a plurality of pillars 304 that are formed on the body lines 303. A plurality of pillars 304 may be formed on each body line 303. The body 302 is vertically formed on the substrate 301. The body lines 303 are vertically formed on the body 302. The pillars 304 may be formed to vertically extend from the body lines 303. For example, the body lines 303 and the pillars 304 may be orthogonal to each other. The plurality of pillars 304 are formed to be separated from one another on the body lines 303. The plurality of pillars 304 may have the array layout of a matrix structure. The pillars 304 may include the channel regions of vertical channel transistors. Furthermore, the pillars 304 may have structures in which the source/drain regions and the channel regions of vertical channel transistors are formed.

The body lines 303 are vertically formed on the bodies 302. A pair of body lines 303 may be formed on each body 302. The body lines 303 may extend in the second direction Y. The buried bit lines 305 and the body lines 303 may extend in the second direction Y in the same manner. The body lines 303 may be formed by seperating each line type active region. Each support 307 is filled between these body lines 303. Body lines 303 may be formed into a pair on each body 302, or may be formed into a pair with each support 307 interposed therebetween. The supporters 307 may be filled in trenches. That is to say, adjacent body lines 303 are separated by the trenches, and the supporters 307 are filled in the trenches. The supporters 307 may include a dielectric layer. The depth of the trenches in which the supporters 307 are filled is deeper than the buried bit lines 305. Accordingly, it is possible to prevent the punch-through between the buried bit lines 305 that are formed with the supporters 307 interposed therebetween. The supporters 307 may extend to be formed between the pillars 304.

The buried bit lines 305 are formed with such shapes that are to be buried in the body lines 303. Each body line 303 may have any one sidewall that is recessed, and each buried bit line 305 may be filled in the recessed sidewall. The pair of body lines 303 that are formed on the body 302 may face each other, thus, recessed sidewalls may face each other. The buried bit lines 305 may extend in the second direction Y. The buried bit lines 305 include a metallic material. As a consequence, the buried bit lines 305 have a low resistance.

A barrier layer 306 is formed between the body lines 303 and the buried bit lines 305. The barrier layer 306 functions to prevent the agglomeration of a metal silicide that constitutes the buried bit lines 305. Thus, the barrier layer 306 contains a material for preventing the agglomeration of the metal silicide. In detail, the barrier layer 306 may contain germanium (Ge). For instance, the barrier layer 306 may be silicon germanium (SiGe). In order to effectively prevent the agglomeration of the metal silicide by germanium, the content of germanium in the barrier layer 306 may be at least approximately 30%.

An interlayer dielectric layer 308 may be formed between the buried bit lines 305. The bottoms of trenches in which the interlayer dielectric layer 308 is filled may be deeper than the buried bit lines 305. Therefore, it is possible to prevent the punch-through between the buried bit lines 305 that are formed with the interlayer dielectric layer 308 interposed therebetween. The interlayer dielectric layer 308 may extend to be formed between the pillars 304. When viewed in the first direction X, the supporters 307, the pillars 304 and the interlayer dielectric layer 308 may be alternately formed.

The word lines 309 are formed on the sidewalls of the pillars 304. The word lines 309 are vertically formed on the sidewalls of the pillars 304, and thus are referred to as vertical word lines. The word lines 309 may be formed on both sidewalls of the pillars 304 and thus, may form double word line structures. Even though the double word line structures are formed, ends of the respective word lines 309 may be connected. Since the pillars 304 serve as regions where the channels of vertical channel transistors are formed, vertical channels are formed by the word lines 309. By this process, vertical channel transistors including the word lines 309, source regions, channel regions and drain regions are formed. The word lines 309 may extend in the first direction X. The word lines 309 include a metallic material. The word lines 309 may include a titanium nitride (TiN), a stack of a tungsten nitride and tungsten (WN/W), etc. The word lines 309 and the buried bit lines 305 may be formed to be separated from each other in the vertical direction. For this purpose, a dielectric layer (not shown) may be additionally formed between the word lines 309 and the buried bit lines 305. Here, the dielectric layer includes a silicon oxide, etc. In a variation, the word lines 309 may extend in the first direction X while surrounding the sidewalls of the pillars 304. Moreover, after forming gate electrodes to surround the sidewalls of the pillars 304, the word lines 309 may be formed to be connected with the gate electrodes.

According to the above-described embodiment, vertical structures are formed in which the buried bit lines 305 are positioned below the pillars 304. Since it is not necessary to form the buried bit lines 305 between the pillars 304, high integration becomes possible.

The buried bit lines 305 are buried in the body lines 303. Accordingly, adjacent buried bit lines 305 are sufficiently separated from each other, and the parasitic capacitance ($C_B$) between adjacent buried bit lines 305 is decreased.

Since the supporters 307 are filled between body lines 303, it is possible to prevent the body lines 303 and the pillars 304 from leaning.

Also, since the trenches in which the supporters 307 are filled and the trenches in which the interlayer dielectric layer 308 is filled are defined deeper than the buried bit lines 305, the punch-through between adjacent buried bit lines 305 may be prevented.

Because the barrier layer 306 containing germanium is formed between the body lines 303 and the buried bit lines 305 including the metal silicide, it is possible to prevent the buried bit lines 305 from breaking due to the agglomeration of the metal silicide.

FIGS. 6A to 6E are cross-sectional views illustrating a method for fabricating a semiconductor device having buried bit lines in accordance with an embodiment of the present invention. Herein, an exemplary method for fabricating a semiconductor device having buried bit lines will be described in succession to the method for fabricating buried bit lines shown in FIGS. 3A to 3L. FIGS. 6A to 6E are cross-sectional views taken along the line B-B' of FIG. 5.

Figure 6A:
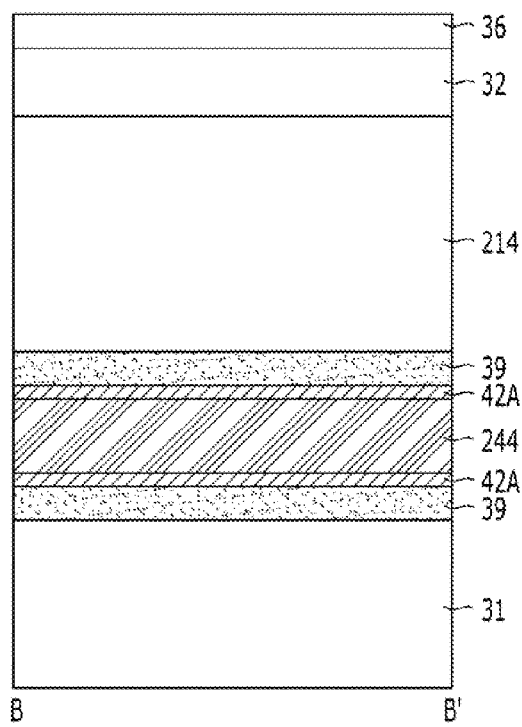
FIGS. 6A to 6E are cross-sectional views illustrating a method for fabricating a semiconductor device having buried bit lines in accordance with an embodiment of the present invention.

Referring to FIG. 6A, the buried bit lines 244 are formed through the series of processes shown in FIGS. 3A to 3L to extend in one direction. The barrier layer 42A containing germanium is formed between the body lines 214 and the buried bit lines 244. The buried bit lines 244 may be formed in the first source/drain regions 39 which are formed in the active regions 210.

Figure 6B:
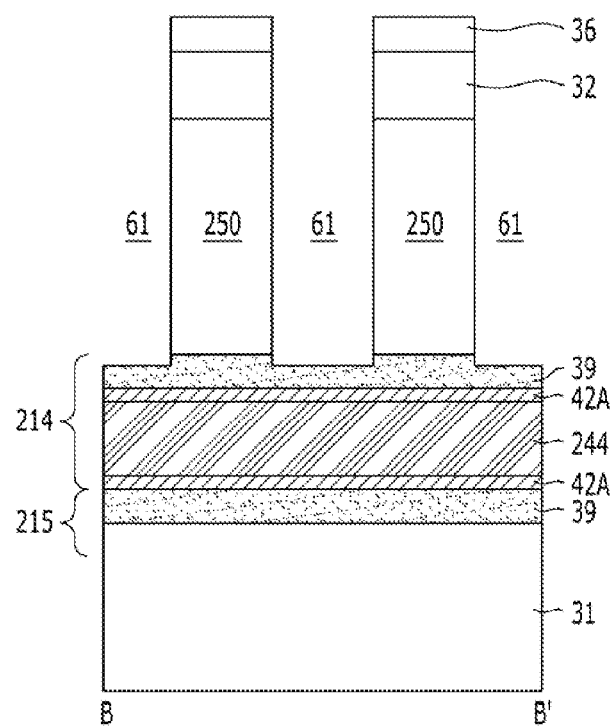

Referring to FIG. 6B, word line trenches 61 are defined. Photoresist patterns (not shown) are used for defining the word line trenches 61. The first mask patterns 32 and the second mask patterns 36 are etched using the photoresist patterns as etch masks. Successively, the upper portions of the body lines 214 are etched by a predefined depth. While not shown in the cross-sectional view taken along the line B-B' of FIG. 5, the interlayer dielectric layer 46 and the supporters 220 may also be etched by the predefined depth.

By etching the upper portions of the body lines 214 by the predefined depth in this way, a plurality of pillars 250 are formed on the body lines 214. The pillars 250 have structures that extend substantially perpendicular to the body lines 214. The pillars 250 are formed by the unit of cell. Accordingly, a plurality of pillars 250 are formed on one body line 214 and are separated from one another by the word line trenches 61. The depth of the word line trenches 61 may have a dimension that does not expose the buried bit lines 244. In detail, the word line trenches 61 may have a depth that does not expose the barrier layer 42A. The pillars 250 have structures where the source/drain regions and the channel regions for vertical channel transistors are formed. The plurality of pillars 250 may have the layout of a matrix type array on the body lines 214.

Figure 6C:
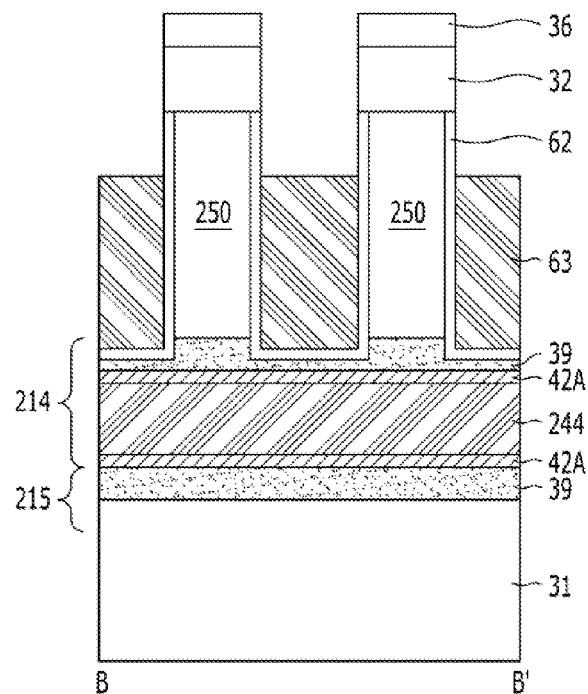

Referring to FIG. 6C, a gate dielectric layer 62 is formed on the surfaces of the body lines 214 and the pillars 250, which are exposed. The gate dielectric layer 62 may be formed by oxidating the sidewalls of the pillars 250 and the upper surfaces of the body lines 214. The oxidation process may be performed using thermal oxidation.

A conductive layer 63 is formed to fill the word line trenches 61. The conductive layer 63 uses a low resistance material. For example, a metallic layer may be used for the conductive layer 63. The metallic layer means a conductive layer including a metal. For example, the metallic layer may include a titanium layer, a titanium nitride layer, a tungsten layer, and so forth.

Planarization and blanket etching (for example, etch-back) are sequentially performed for the conductive layer 63. A planarization process may be performed using chemical mechanical polishing (CMP). The planarization process may be performed until the second mask patterns 36 are exposed. The blanket etching is performed after the planarization. In the blanket etching, an etching amount for the conductive layer 63 may be controlled according to a predetermined channel length.

Figure 6D:
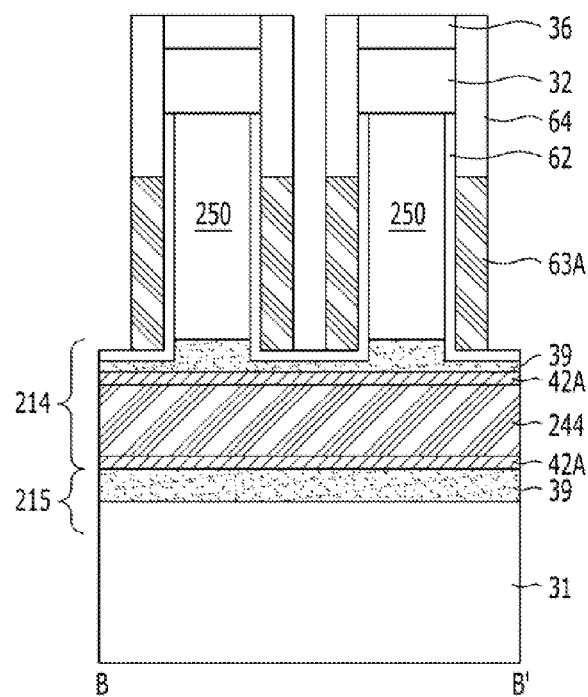

Referring to FIG. 6D, by depositing a dielectric layer on the surface of the structure including the conductive layer 63 and then performing blanket etching (for example, etch-back), spacers 64 are formed. The spacers 64 may be formed as any one selected from the group consisting of an oxide layer, a nitride layer and an oxynitride layer. For instance, the spacers 64 may be formed as a nitride layer.

The conductive layer 63 is etched using the spacers 64 as etch masks. Accordingly, vertical word lines 63A are formed on both sidewalls of the pillars 250. The vertical word lines 63A also serve as vertical gate electrodes. In a variation for the vertical word lines 63A, the vertical word lines 63A may be formed to surround the pillars 250. In another variation, after forming annular vertical gate electrodes surrounding the pillars 250, vertical word lines 63A may be formed in such a way as to connect adjacent vertical gate electrodes with each other. The vertical word lines 63A may be formed to extend in a direction crossing with the buried bit lines 244.

Figure 6E:
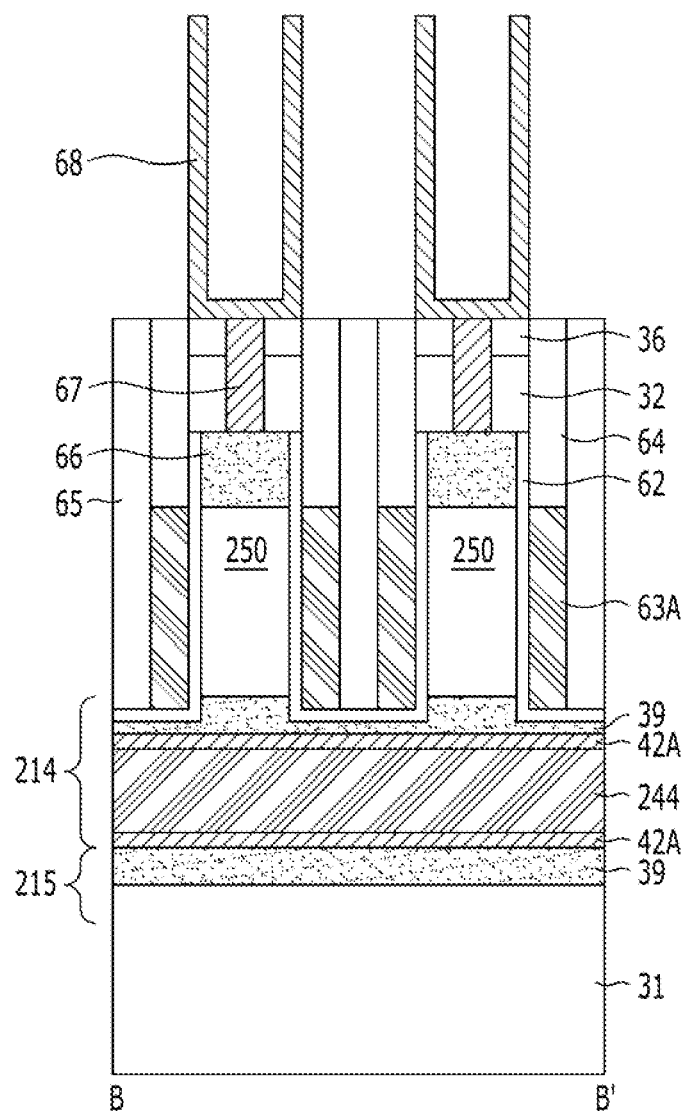

Referring to FIG. 6E, a word line isolation layer 65 for isolating the vertical word lines 63A from one another is formed. The word line isolation layer 65 includes a dielectric layer. The word line isolation layer 65 may be formed by forming a dielectric layer on the entire structure formed with the vertical word lines 63A and then performing planarization until the second mask patterns 36 are exposed.

By performing storage node contact etching, the upper surfaces of the pillars 250 are exposed. Then, storage node contact (SNC) plugs 67 are formed. Before forming the storage node contact plugs 67, second source/drain regions 66 may be formed in the upper portions of the pillars 250 by performing ion implantation. The second source/drain regions 66 may be formed by adopting an ion implantation generally known in the art. Accordingly, the pillars 250 may include the second source/drain regions 66 and vertical channel regions. The vertical channel regions are formed between the first source/drain regions 39 and the second source/drain regions 66. The second source/drain regions 66 may be connected with capacitors. The first source/drain regions 39, the vertical channel regions and the second source/drain regions 66 may be connected with one another in the vertical direction. The first source/drain regions 39 and the second source/drain regions 66 may form NPN junctions or PNP junctions in cooperation with channel regions. For example, when the first source/drain regions 39 and the second source/drain regions 66 are doped with impurities of a first conductivity type, the channel regions may be doped with impurities of a second conductivity type different from the first conductivity type. For example, when the impurities of the first conductivity type are N type impurities, the impurities of the second conductivity type include P type impurities. Conversely, when the impurities of the first conductivity type are P type impurities, the impurities of the second conductivity type include N type impurities. When the vertical channel transistors are NMOSFETs, the first source/drain regions 39, the channel regions and the second source/drain regions 66 may form NPN junctions.

Storages are formed on the storage node contact plugs 67. The storages indicate means for storing logic information in a semiconductor memory device and may include capacitors. The capacitors include storage nodes 68. The storage nodes 68 may have the shapes of cylinders. In another embodiment, the storage nodes 68 may have the shapes of pillars or concaves. While not shown in a drawing, a dielectric layer and top electrodes are subsequently formed.

A semiconductor device having the buried bit lines 244 may be formed through the above-described processing procedure. While descriptions were made up to a method for forming vertical channel transistors with the buried bit lines 244 and capacitors, the semiconductor device may be completed by performing subsequent processes for forming metal lines, etc. according to a method generally known in the art.

Figure 7:
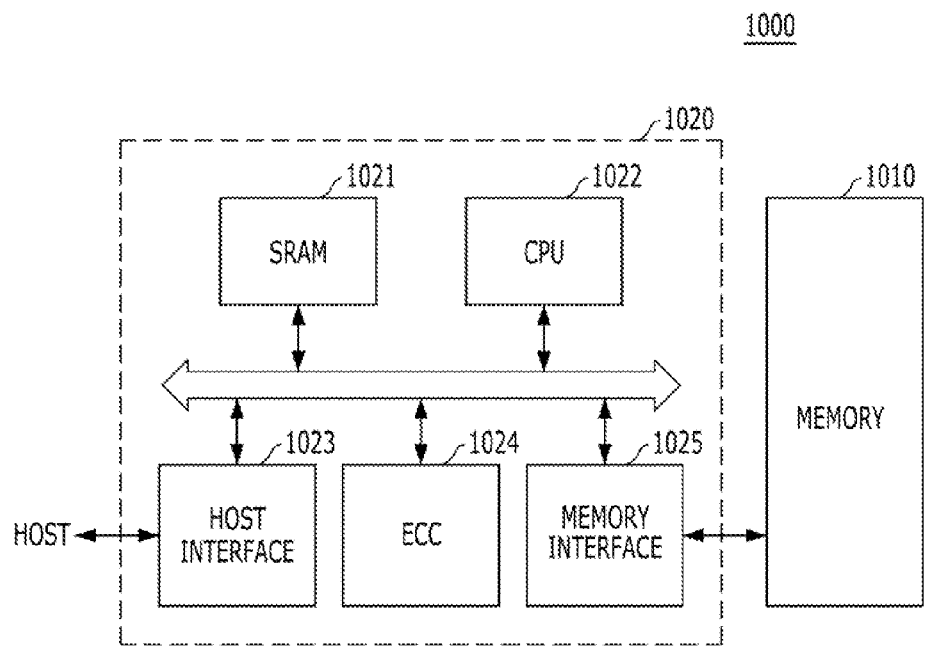
FIG. 7 is a block diagram illustrating a memory card including the semiconductor device according to the embodiments of the present invention.

FIG. 7 is a block diagram illustrating a memory card including the semiconductor device according to the embodiments of the present invention.

Referring to FIG. 7, the semiconductor device according to the embodiments of the present invention may be applied to a memory card 1000. For instance, the memory card 1000 may include a memory controller 1020 that controls general data exchange between a host HOST and a semiconductor memory 1010. The memory controller 1020 may include an SRAM 1021, a central processing unit (CPU) 1022, a host interface 1023, an error correction code (ECC) 1024, and a memory interface 1025. The SRAM 1021 may be used as an operating memory of the central processing unit 1022. The host interface 1023 may include the data exchange protocol of the host that is connected with the memory card 1000. The error correction code 1024 may detect and correct an error that is included in the data read out from the semiconductor memory 1010. The memory interface 1025 interfaces with the semiconductor memory 1010. The central processing unit 1022 performs general control operations for the data exchange of the memory controller 2020.

As the semiconductor memory 1010 applied to the memory card 1000 includes the semiconductor device having buried bit lines in accordance with the embodiments of the present invention, the parasitic capacitance between adjacent buried bit lines may be decreased so that signal transfer characteristics may be improved, and the buried bit lines are prevented from breaking so that the characteristics and the reliability of the semiconductor device may be improved.

Figure 8:
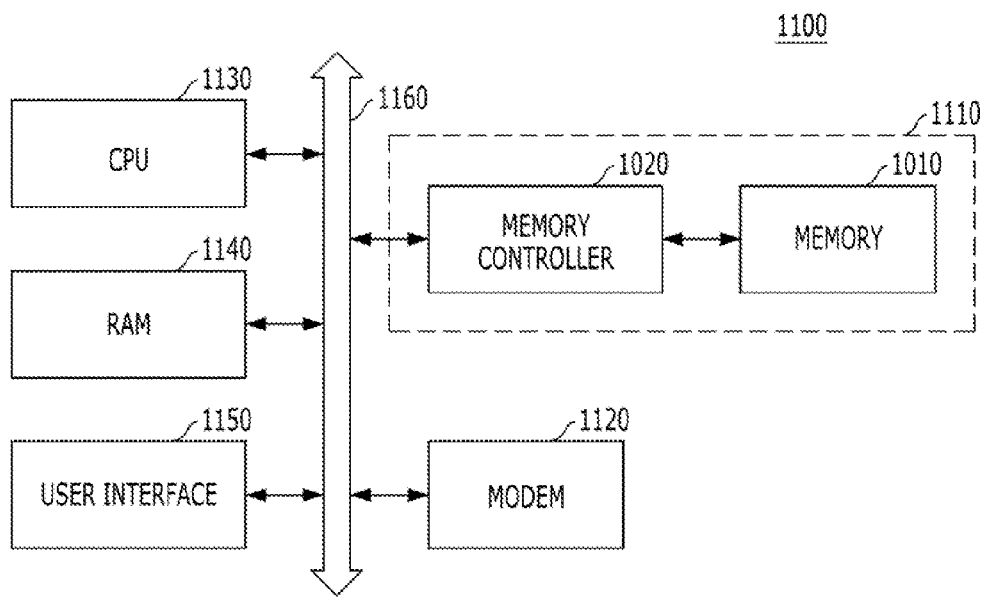
FIG. 8 is a block diagram schematically illustrating an exemplary electronic system including the semiconductor device according to the embodiments of the present invention.

FIG. 8 is a block diagram schematically illustrating an exemplary electronic system including the semiconductor device according to the embodiments of the present invention.

Referring to FIG. 8, an electronic system 1100 including the semiconductor device according to the embodiments of the present invention may include a memory system 1110, and a modem 1120, a central processing unit 1130, a RAM 1140 and a user interface 1150, which are electrically connected to a system bus 1160. The data processed by the central processing unit 1130 or the data inputted from an outside may be stored in the memory system 1110. The memory system 1110 may include a memory 1010 and a memory controller 1020 and may be configured in substantially the same way as the memory card 1000 described above with reference to FIG. 7.

The electronic system 1100 may be provided as a personal digital assistant (PDA), a portable computer, a web tablet, a wireless phone, a mobile phone, a digital music player, a memory card, electronic products capable of transmitting and/or receiving information under wireless circumstances, a solid state disk, a camera image processor, an application chipset, and so forth.

As is apparent from the above descriptions, according to the various embodiments, since body lines are formed after forming supporters, it is possible to prevent the body lines from leaning.

Furthermore, according to the various embodiments, since a barrier layer is formed to surround buried bit lines including a metal silicide, it is possible to prevent the buried bit lines from breaking due to the agglomeration of the metal silicide.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
    body lines, formed substantially perpendicular to a substrate, and having recessed sidewalls;
    buried bit lines, buried in the recessed sidewalls; and a barrier layer, interposed between each of the buried bit lines and each of the body lines corresponding thereto.

2. The semiconductor device according to claim 1, wherein each of the buried bit lines comprises a metal silicide and the barrier layer comprises germanium.

3. The semiconductor device according to claim 2, wherein the barrier layer includes silicon germanium.

4. The semiconductor device according to claim 2, wherein a content of germanium in the barrier layer is at least approximately 30%.

5. The semiconductor device according to claim 2, wherein the metal silicide comprises a cobalt silicide.

6. A semiconductor device comprising:
    a plurality of active regions separated from one another;
    a plurality of first trenches defined in a substrate, wherein the plurality of active regions are separated from one another by the plurality of first trenches;
    supporters filled in the plurality of first trenches;
    second trenches, each separating each of the plurality of active regions, and each having recessed sidewalls that face each other;
    a pair of separated buried bit lines, formed in each of the second trenches, and including a metal silicide; and
    a barrier layer, interposed between the pair of separated buried bit lines and each of the second trenches, and containing germanium.

7. The semiconductor device according to claim 6, wherein each of the plurality of active regions comprises:
    a body formed over the substrate;
    a pair of body lines, separated by each of the second trenches over the body, and having the recessed sidewalls; and
    a plurality of pillars formed over each of the pair of body lines.

8. The semiconductor device according to claim 6,
    wherein the plurality of pillars includes channel regions for vertical channel transistors, and
    wherein the semiconductor device further comprises:
    storages connected to the plurality of pillars.

9. The semiconductor device according to claim 6, wherein the supporters comprise a dielectric material.

10. The semiconductor device according to claim 6, wherein the barrier layer comprises silicon germanium.

11. The semiconductor device according to claim 6, wherein a content of germanium in the barrier layer is at least approximately 30%.

12. The semiconductor device according to claim 6, wherein the metal silicide comprises a cobalt silicide.

* * * * *